(12) United States Patent
Qiu et al.

(10) Patent No.: US 10,312,882 B2
(45) Date of Patent: Jun. 4, 2019

(54) TUNABLE FILM BULK ACOUSTIC RESONATORS AND FILTERS

(71) Applicants: Cindy X. Qiu, Brossard (CA); Ishiang Shih, Brossard (CA); Chunong Qiu, Brossard (CA); Andy Shih, Brossard (CA); Julia Qiu, Brossard (CA); Yi-Chi Shih, Los Angeles, CA (US)

(72) Inventors: Cindy X. Qiu, Brossard (CA); Ishiang Shih, Brossard (CA); Chunong Qiu, Brossard (CA); Andy Shih, Brossard (CA); Julia Qiu, Brossard (CA); Yi-Chi Shih, Los Angeles, CA (US)

(*) Notice: Subject to any disclaimer, the term of this patent is extended or adjusted under 35 U.S.C. 154(b) by 0 days.

(21) Appl. No.: 14/756,018

(22) Filed: Jul. 22, 2015

(65) Prior Publication Data

US 2017/0025596 A1 Jan. 26, 2017

(51) Int. Cl.
*H03H 3/04* (2006.01)
*H03H 9/00* (2006.01)
*H03H 9/02* (2006.01)
*H03H 9/17* (2006.01)
*H03H 9/56* (2006.01)
(Continued)

(52) U.S. Cl.
CPC ......... *H03H 9/02015* (2013.01); *H01P 1/201* (2013.01); *H03H 9/0014* (2013.01); *H03H 9/02031* (2013.01); *H03H 9/173* (2013.01); *H03H 9/568* (2013.01); *H03H 9/583* (2013.01); *H03H 2003/0464* (2013.01); *H03H 2009/02196* (2013.01)

(58) Field of Classification Search
CPC ........... H03H 9/02015; H03H 9/02031; H03H 2009/02165; H03H 2009/02173; H03H 2009/02188; H03H 2009/02196; H03H 9/173; H03H 9/174; H03H 9/175; H03H 9/587; H03H 9/588; H03H 9/589; H03H 9/0014; H03H 9/568; H03H 9/583; H03H 2003/0464; H01P 1/201
USPC .......................................... 333/187, 188, 189
See application file for complete search history.

(56) References Cited

U.S. PATENT DOCUMENTS 5,446,306 A * 8/1995 Stokes ............... H03H 9/02102
257/416
6,556,103 B2 * 4/2003 Shibata ............... H03H 9/0207
310/324
(Continued)

*Primary Examiner* — Barbara Summons

(57) ABSTRACT

In wireless communications, many radio frequency bands are used. For each frequency band, there are two frequencies, one for transmitting and the other for receiving. As the band widths are small and separation between adjacent bands is also small, many band pass filters with different band pass frequencies are required for each communication unit such as mobile handset. The invention provides tunable film bulk acoustic resonators TFBARs containing semiconducting piezoelectric layers and methods for tuning and adjusting the resonant properties. When a DC biasing voltage is varied, both the depletion region thickness and neutral region thickness associated in the semiconducting piezoelectric layers varies leading to changes in equivalent capacitances, inductance and resistances and hence the resonance properties and frequencies. A plurality of the present TFBARs are connected into a tunable oscillator or a tunable and selectable microwave filter for selecting and adjusting of the bandpass frequency by varying the biasing voltages.

20 Claims, 7 Drawing Sheets

(51) Int. Cl.
    *H03H 9/58*       (2006.01)
    *H01P 1/201*      (2006.01)

(56) References Cited

U.S. PATENT DOCUMENTS

| | | | | |
|---|---|---|---|---|
| 7,098,573 | B2 * | 8/2006 | Stommer | H03H 3/04 |
| | | | | 310/320 |
| 7,304,551 | B2 * | 12/2007 | Kawamura | H03H 9/706 |
| | | | | 333/133 |
| 7,504,910 | B2 * | 3/2009 | Kawamura | H03H 9/02086 |
| | | | | 310/324 |
| 7,701,312 | B2 * | 4/2010 | Park | H03H 3/04 |
| | | | | 333/186 |
| 7,977,850 | B2 * | 7/2011 | Allah | H03H 9/174 |
| | | | | 310/320 |
| 8,575,819 | B1 * | 11/2013 | Bhugra | H03H 9/173 |
| | | | | 310/317 |
| 2003/0067368 | A1 * | 4/2003 | Ohara | H03H 9/0095 |
| | | | | 333/188 |
| 2004/0070471 | A1 * | 4/2004 | Zhu | H01P 1/20336 |
| | | | | 333/207 |
| 2005/0212612 | A1 * | 9/2005 | Kawakubo | H03H 9/542 |
| | | | | 331/117 R |
| 2013/0027153 | A1 * | 1/2013 | Shin | H03H 9/02102 |
| | | | | 333/133 |
| 2013/0342285 | A1 * | 12/2013 | Kadota | H01G 7/06 |
| | | | | 333/188 |

* cited by examiner

TUNABLE FILM BULK ACOUSTIC RESONATORS AND FILTERS

FIELD OF THE INVENTION

This invention relates to tunable and adjustable filtering of frequency and frequency generation of RF signals for communication systems. More specifically, it relates to tunable and adjustable piezoelectric semiconductor filters with controlled doping levels.

BACKGROUND OF THE INVENTION

Communication systems that operate at radio frequencies (RF) require small and low cost bandpass filters and oscillators. These bandpass filters and oscillators are required to generate, select transmit or receive signals within a certain band width (BW) at a specified frequency and to reject signals at frequencies outside the band width. Some examples include global positioning systems (GPS), mobile telecommunication systems: Global Systems for Mobile Communications (GSM), personal communication service (PCS), the Universal Mobile Telecommunications System (UMTS), Long Term Evolution Technology (LTE), data transfer units: Bluetooth, Wireless Local Area Network (WLAN), and satellite broadcasting and future traffic control communications. The bandpass filters are also used in other high frequency systems for high rate data transmission/acquisition in air and space vehicles.

There are few types of bandpass filters and oscillators for RF signal filtering that are fabricated using different technologies: (a) ceramic filters oscillators based on dielectric resonators; (b) filters or oscillators using surface acoustic wave resonators (SAW); and (c) filters or oscillators using thin film bulk acoustic wave resonators (FBAR). For simplicity reasons, the following description will concentrate on RF filters as the main principles of oscillators may be derived easily from this for those skilled in the art. In mobile communication systems such as handsets, the power capability required for the RF filters is about 5 W or less which is not high, but the size and cost requirements are quite critical. Because of this, the RF filters in handsets are usually manufactured on wafers by microelectronic fabrication processes and they either take a SAW form or a FBAR form based on piezoelectric properties of materials. The main properties of piezoelectric materials for filters are propagation velocity of acoustic waves which determines the resonant frequency along with electrode pitch and the coupling coefficients which affect the band width. FIG. 1A shows a schematic diagram of a prior art surface acoustic wave filter (SAW 100*a*) on a piezoelectric substrate (110S). It comprises an input inter digital transducer IDT1 (120S) with a center-to-center distance between adjacent electrodes controlled to a "pitch" and an output inter digital transducer IDT2 (150S) with a center-to-center distance between adjacent electrodes again controlled to the "pitch". The IDT1 (120S) is connected to an electrical signal source (130S) to excite acoustic waves (140S) with a velocity v and at a frequency $f_o = v/(2 \times pitch)$. The IDT2 (150S) is to receive the acoustic waves (140S) and covert them into an output electrical signal (160S). Electrical signals in the signal source (130S) at frequencies other than $f_o$ cannot excite resonant acoustic waves with sufficient level to reach the output inter digital transducer (150S) to generate an output in the output terminals. Therefore, once a SAW filter has been fabricated, the central frequency $f_o$ of transmission signals and bandwidth BW are fixed by the geometry and materials used. Only the electrical signals at $f_o$ and within the bandwidth BW are allowed to reach the output inter digital transducer (120S) from the input inter digital transducer (150S).

Velocities of acoustic waves in piezoelectric materials are important for designing acoustic filters. Values for several piezoelectric substrates are given here: ~4,000 m/s for LiNbO$_3$, ~6,300 m/s for ZnO, ~10,400 m/s for AlN and ~7,900 m/s for GaN. To obtain a filter on LiNbO$_3$ with a central frequency $f_o$=2 GHz, the wavelength of the acoustic wave is $\lambda = (4000 \text{ msec})/(2 \times 10^9/\text{sec}) = 2 \times 10^{-4}$ cm. The value of electrode pitch in FIG. 1A is then equal to 1 μm. Assume that the width of electrodes and space between adjacent electrodes are equal, then the electrode width is 0.5 μm. To fabricate IDTs at higher frequencies, more advanced lithography tools and more severe processing control will be needed. As the width of electrodes is reduced to below 0.5 μm, unwanted series resistance associated with the electrodes will increase to degrade the performance of the SAW filters. Therefore, SAW filters as shown in FIG. 1A are often limited to applications at frequencies near or below 1 GHz. To maintain the performance for operation at high frequencies and to reduce the manufacturing cost, another filter structures have been developed: the film bulk acoustic resonator (FBAR). The acoustic filters based on the FBAR are capable of operation at frequencies from a few hundred MHz to 40 GHz. It is noted that SAW filters have a footprint which is about twice of that for FBAR filters with similar electrical performance at frequencies of about of 1 GHz.

FIG. 1B shows a schematic cross-sectional diagram of a prior art film bulk acoustic resonator FBAR (100*b*) on a substrate (110) having a substrate thickness (110*t*). The FBAR (100*b*) comprises an air cavity (115) having an air cavity depth (115*t*), a bottom electrode (140) with a bottom electrode thickness (140*t*), a piezoelectric layer (150) with a piezoelectric layer thickness (150*t*), a top electrode (160) with a top electrode thickness (160*t*). The purpose of the air cavity (115) is to prevent the acoustic waves (185) from getting into the substrate (110) and to confine them in the piezoelectric layer (150). The resonant frequency is mainly determined by the piezoelectric layer thickness (150*t*). Through isolation of the air cavity (115), the acoustic energy is confined in the piezoelectric layer (150) with minimum loss into the substrate. However, due to the presence of the air cavity (115), the dissipation of heat generated in the piezoelectric layer (150) and the metal electrodes (140, 160) to the substrate (110) of the FBAR is limited, as there is no other major heat conduction paths. Therefore, the operating power of systems involving the FBAR with the air cavity (115) can not be too high in order to prevent the instability of the circuits due to excessive heating of the piezoelectric layer (150). To improve dissipation of heat from the piezoelectric layer, another structure of FBAR has been adopted and used in RF filters.

FIG. 1C shows a schematic cross-sectional diagram of another prior art FBAR which is called a solidly mounted bulk acoustic resonator (SMBAR or SMR) (100*c*) as it is solidly mounted on a substrate. The SMBAR is deposited on the substrate (110) with a substrate thickness (110*t*). It comprises a thin film reflector stack (120) having alternative low impedance layers (120-L1, 120-L2, 120-L3) with a low impedance layer thickness (120-Lt) and high impedance layers (120-H1, 120-H2) with a high impedance layer thickness (120-Ht); a total thin film reflector stack thickness (120Tt); a bottom electrode (140) with a bottom electrode thickness (140*t*); a piezoelectric layer (150) with a piezoelectric layer thickness (150*t*); a top electrode (160) with a top electrode thickness (160t). The resonant frequency $f_o$ is determined by acoustic waves (185) of a velocity v and the piezoelectric layer thickness (150t). To confine the acoustic wave energy in the piezoelectric layer and to minimize the loss to the substrate (110), low impedance layer thickness (120-Lt) and high impedance layer thickness (120-Ht) are selected to be λ/4, here λ is the acoustic wavelength in the respective layers. Since there is no air gap between the piezoelectric layer (150) and the substrate (110), the dissipation rate of heat generated in the piezoelectric layer (150) and the electrode layers (140, 160) to the substrate (110) is greater than that of the FBAR (100b) with an air gap (115) as shown in FIG. 1B. Once a filter involving FBARs has been fabricated, the central frequency $f_o$ of transmission and the bandwidth BW are determined by the geometry and materials used.

The frequencies and bandwidths of RF signals for communications have been defined and assigned by regions or countries. For mobile communications, there are about 40 bands. More bands are expected for the next generation long term extension technology. Table 1 gives several selected bands for mobile communications used in different regions or countries. In each band there is a transmit band (Tx Band) at $f_{oTR}$ with a transmit band width ($BW_{TR}$). There is also an associated receive band (Rx Band) at $f_{oRE}$ with a receive band width ($BW_{RE}$). The separation between the transmit band and receive band is given by the difference between the transmit band central frequency $f_{oRE}$ and the receive band central frequency $f_{oTR}$: $f_{oRE}$-$f_{oTR}$.

electric layer (150) between two metal electrodes (140, 160). As stated before, the response of this FBAR is determined by the material properties, especially the properties of the piezoelectric layer; the two electrodes; physical dimensions (the area and thickness) of the piezoelectric layer and the two electrodes.

The variation of the lossless input electrical impedance versus frequency of the FBAR in FIG. 1E is given in FIG. 1F. There are two resonant frequencies close to each other: $f_a$ where the impedance approaches infinity and $f_r$ where the impedance approaches zero. Between these two frequencies, the FBAR behaves inductively. Outside the band between $f_r$ and $f_a$ it behaves capacitively with capacitance $C_o$. The resonant frequencies $f_a$ and $f_x$ of FBAR will determine the bandwidth when a plurality of the FBARs are connected to form a microwave acoustic filter.

There are several wireless standards used in different countries and regions. The main ones are briefly described below.

Global System for Mobile Communications (GSM) is a standard developed by the European Telecommunication Standards Institute to provide protocols for 2G digital cellular networks for mobile phones and first deployed in 1992 in Finland. Recently, GSM has become a global standard for mobile communications operating in many countries and regions.

Personal Communication Service (PCS) describes a set of 3G wireless communications capabilities which allows certain terminal mobility, personal mobility and service man-

TABLE 1

Band frequencies and bandwidth for some of the Bands assigned to mobile handsets and base stations.

| Band | $f_{oTR}$ (MHz) | $BW_{TR}$ (MHz) | $f_{oRE}$ (MHz) | $BW_{RE}$ (MHz) | $f_{oRE}$ - $f_{oTR}$ (MHz) | Region |
|---|---|---|---|---|---|---|
| 1 | 1920-1980 | 60 | 2110-2170 | 60 | 190 | Asia, EMEA, Japan |
| 2 | 1850-1910 | 60 | 1930-1990 | 60 | 80 | N. America, Latin Am. |
| 3 | 1710-1785 | 75 | 1805-1880 | 75 | 95 | Asia, EMEA |
| 4 | 1710-1755 | 45 | 2110-2155 | 45 | 400 | N. America, Latin Am. |
| 5 | 824-849 | 25 | 869-894 | 25 | 45 | N. America, Latin Am. |
| 7 | 2500-2570 | 70 | 2620-2690 | 70 | 120 | Asia, EMEA |
| 8 | 880-915 | 35 | 925-960 | 35 | 45 | EMEA, Latin Am. |
| 12 | 699-716 | 17 | 729-746 | 17 | 30 | N. America |

FIG. 1D demonstrates the narrow frequency bands for transmit and receive in wireless communication system, showing a central frequency for transit $f_{oTR}$, a transmit band width $BW_{TR}$, a central frequency for receive $f_{oRE}$, and a receive band width $BW_{RE}$. The difference of central frequencies $f_{oTR}$ and $f_{oRE}$ is selected to be close to $BW_{TR}$+$BW_{RE}$ to increase the communications capacity. Due to the finite $BW_{TR}$ and $BW_{RE}$, the separation between the $BW_{TR}$ and $BW_{RE}$ is often small and sometimes an overlap between the two will show. In practical communication systems, the narrow frequency bands capability is implemented using filters with characteristics schematically shown by Curve 1(d) in FIG. 1D for receive band. (Similar characteristic curve for the transmit band can be obtained.) From Curve 1(d), an unwanted attenuation is observed which constitutes an Insertion Loss. This Insertion Loss should be made as small as possible. In Curve 1(d), an unwanted small transmission in the frequency ranges outside the receiving frequency bands is also observed which defines an Isolation. The magnitude of this Isolation should be made as large as possible.

The FBAR (FIG. 1C) resembles a parallel plate capacitor as shown in a simplified diagram in FIG. 1E with a piezoagement. In Canada, the United States and Mexico, PCS are provided in 1.9 GHz band (1.850-1.990 GHz) to expand the capacity originally provided by the 850 MHz band (800-894 MHz). These bands are particular to the North America although other frequency bands are also used.

The Universal Mobile Telecommunications System or UMTS is a 3G mobile cellular system for networks based on the GSM standard. UMTS uses wideband code division multiple access (W-CDMA) radio access technology to offer greater spectral efficiency and bandwidth to mobile network operators.

Long-Term Evolution (LTE) is a 4G standard for wireless communication with high-speed data for mobile phones and data terminals. It is an upgrade based on the GSM and UMTS network technologies. Different LTE frequencies and bands from about 1 GHz to 3 GHz are used in different countries and regions. There are unlicensed bands in the range from 3 GHz to 6 GHz which maybe used in the near future for mobile communications to increase capacity. Therefore, mobile phones must be equipped with multiple bands modules in order to be used in different countries and regions.

Currently, there are about 40 bands or frequency ranges used for wireless communications in different countries and regions. In the near future, more bands in the frequency range from 3 GHz to 6 GHz are expected due to the need in capacity. Due to the large number of bands used in the mobile handsets in different regions and countries, and even in same country, a practical handset needs to have an RF front end covering several frequency bands. A true world phone will need to have about 40 bands, each with a transmit band and receive band. As each RF filter has only one central frequency of resonant and one bandwidth which are fixed, therefore, such a true world phone will need to have 80 filters for the front end. Due to the resource limitations, some designers design mobile phone handsets to cover 5 to 10 bands for selected regions or countries. Even with this reduced number of bands, the number of RF filters currently required is still large: from 10 to 20 units. Therefore, there are strong needs to reduce the dimensions and cost of the RF filters and to reduce the number of filters for the same number of operation bands by having tunable RF filters, each to cover at least two frequency bands. If this is successful, the number of filters can be reduced in the mobile handsets and many other microwave and wireless systems. Thus, it would be ideal to develop an RF filter which can cover as many bands or frequency ranges as possible so that the size and power consumption of RF front ends in a mobile phone handset and microwave systems can be reduced.

BRIEF SUMMARY OF THE INVENTION

One object of the invention is to provide an RF resonator with a Metal-Doped piezoelectric semiconductor-Metal or a MDM structure for forming an oscillator or a microwave acoustic filter with the central frequency of resonant and/or the bandwidth adjustable and tunable by a first DC biasing voltage for the construction wireless or microwave systems.

The other object of the invention is to provide an RF resonator with a Metal-Intrinsic piezoelectric layer-Doped piezoelectric semiconductor-Metal or a MIDM structure for forming an oscillator or a microwave acoustic filter with the central frequency of resonant and/or the bandwidth adjustable and tunable by a first DC biasing voltage.

One other object of the invention is to provide an RF resonator with a Metal-Doped piezoelectric semiconductor-Intrinsic piezoelectric layer-Metal or a MDIM structure for forming an oscillator or a microwave acoustic filter with the central frequency of resonant and/or the bandwidth adjustable and tunable by a first DC biasing voltage.

Another object of the invention is to provide an RF resonator with a Metal-Doped piezoelectric semiconductor-Intrinsic piezoelectric layer-Doped piezoelectric semiconductor-Intrinsic piezoelectric layer-Doped piezoelectric semiconductor-Metal or a MDIDIDM structure for forming an oscillator or a microwave acoustic filter with the central frequency of resonant and/or the band width adjustable and tunable by a first DC biasing voltage.

Yet another object of this invention is to provide an RF resonator with a Metal-Doped piezoelectric semiconductor-Intrinsic piezoelectric layer-Doped piezoelectric semiconductor-Metal or a MDIDM structure for forming an oscillator or a microwave acoustic filter with the central frequency of resonant and/or the bandwidth adjustable and tunable by a first DC biasing voltage.

Still another object of this invention is to provide a Metal-Doped piezoelectric semiconductor-Doped piezoelectric semiconductor-Metal or a MDDM structure for RF resonator on a substrate for forming an oscillator or a microwave acoustic filter with the central frequency of resonant and/or band width adjustable and tunable by a first DC biasing voltage.

Still another object of this invention is to provide a tunable filter with a plurality of tunable series resonators, a plurality of tunable parallel resonators, a plurality of coupling capacitors, a plurality of isolation inductors and with a first DC voltage source to control and select resonant frequencies of the resonators and to tune and control the central frequency of transmission of microwaves for the tunable filter.

Yet still another object of this invention is to provide a tunable filter with a plurality of tunable series resonators, a plurality of tunable parallel resonators, a plurality of coupling capacitors, a plurality of isolation inductors and with a first DC voltage source and a second DC voltage source to control and select resonant frequencies of the resonators and to tune and control the central frequency of transmission of microwaves for the tunable filter.

DETAILED DESCRIPTION OF THE INVENTION

Figure 1A:
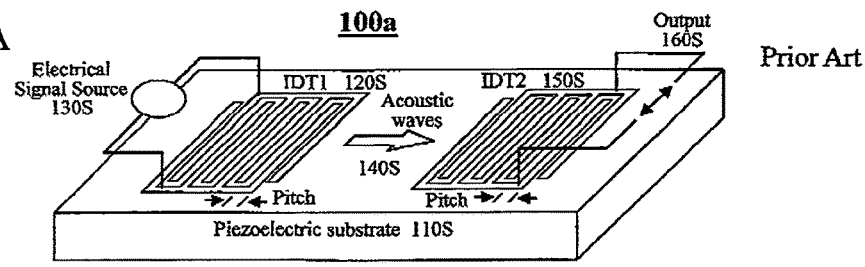
FIG. 1A A schematic diagram shows a prior art surface acoustic wave SAW filter on a piezoelectric substrate (110a).
Figure 1B:
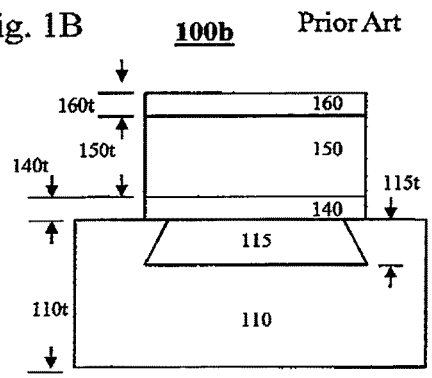
FIG. 1B A schematic cross-sectional diagram shows a prior art film bulk acoustic resonator FBAR (100b) with an air cavity, a bottom electrode, a piezoelectric layer, and a top electrode. The resonant frequency is mainly determined by the piezoelectric layer thickness and the velocity of the acoustic waves.
Figure 1C:
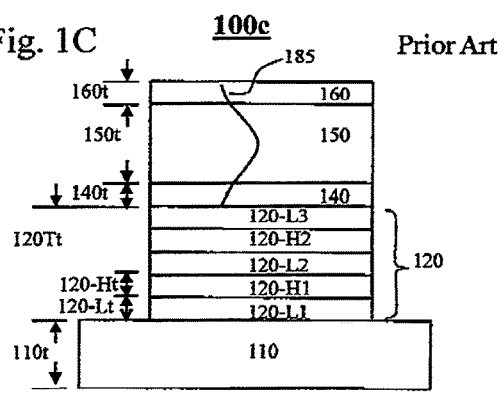
FIG. 1C A schematic cross-sectional diagram shows a prior art solidly mounted bulk acoustic resonator SMBAR (100c) with a thin film reflector stack, a bottom electrode, a piezoelectric layer, and a top electrode. The resonant frequency is determined by the velocity of acoustic waves and the piezoelectric layer thickness.
Figure 1D:
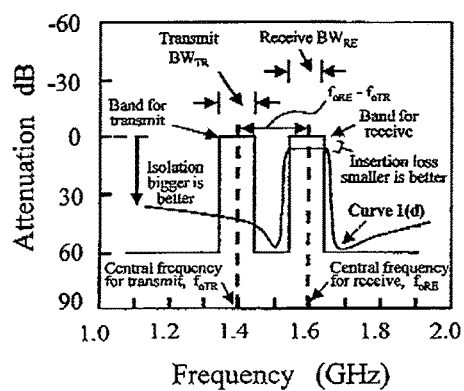
FIG. 1D is a diagram showing the narrow transmission frequency bands of microwaves for transmitting and receiving in wireless communications. In practical communication systems, each narrow transmission frequency band is achieved using a filter with characteristics shown by Curve 1(d).
Figure 1E:
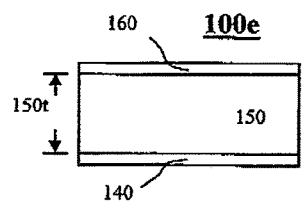
FIG. 1E A FBAR resembles a parallel plate capacitor with a piezoelectric layer between two metal electrodes. The response of this FBAR is determined by the material properties of the piezoelectric layer and the physical dimensions.
Figure 1F:
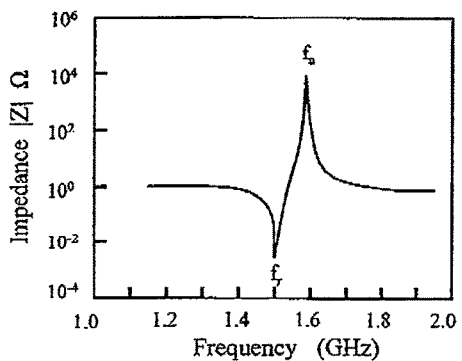
FIG. 1F is a diagram of the lossless input electrical impedance versus frequency of the FBAR shown in FIG. 1E, showing are two resonant frequencies: $f_a$ and $f_r$.

Several material and device effects affecting the acoustic properties of piezoelectric solids related to this invention are described. These effects are advantageously used in this invention to provide resonators and filters with tunable and adjustable resonant properties and frequencies by varying a biasing voltage according to this invention.

Active Piezoelectric Layer Thickness Effect:

In a conventional film bulk acoustic resonator (FBAR) without the tuning capability, the resonant frequency is determined by several material properties. When the loading effect and thickness effect of the electrodes are ignored, the resonant frequency $f_o$, is determined by the acoustic wave velocity v in the piezoelectric layer and the thickness of the piezoelectric layer t so that: $f_o=v/(2t)$. In an article "Design of Computer Experiments: a powerful tool for the numerical design of BAW filters" (2008 IEEE International Ultrasonic Symposium Proceedings, p. 2185-p. 2188), A. Reinhardt et al presented the variation of resonant frequencies of Mo/AlN/Mo piezoelectric stack with the variation of thickness of the piezoelectric AlN layer. For a piezoelectric stack with an AlN thickness of 1 µm, the resonant frequency $f_o$ is 2.2 GHz. As the AlN thickness is increased from 1 µm to 2 µm, the resonant frequency of piezoelectric stack decreases essentially linearly from 2.2 GHz to 1.61 GHz. It is noted that the above results are from different FBARs fabricated individually to have different AlN thicknesses in order to obtain the different resonant frequencies.

According to one embodiment of this invention, the resonant properties of thin film bulk acoustic wave resonators (FBAR) or solidly mounted bulk acoustic resonator (SMRs or SMBARs) are tuned and adjusted by applying and varying a DC voltage to vary the depletion region thickness of a semiconducting piezoelectric layer with a controlled doping concentration ($N_D$). According to this embodiment, a neutral region and a depletion region are formed in the doped semiconducting piezoelectric layer. The piezoelectric layer neutral region is conductive with conductivity approximately proportional to $N_D$ whereas the piezoelectric layer depletion region is intrinsic and electrically insulating due to a low free carrier density. The thickness of the piezoelectric layer depletion region is adjusted by varying the DC voltage and the depletion region constitutes entire or a part of a piezoelectric active layer to allow interactions between the RF signals and acoustic signals to take place. Since the interactions between the RF signals and acoustic signals take place mainly in the piezoelectric active layer, they are affected by the thickness of the piezoelectric active layer. Therefore, the resonant properties and frequencies of the FBARs and SMRs (or SMBARs) and any filters, switches or other devices based on the semiconducting piezoelectric layers microwave acoustic effect can be tuned and adjusted by changing the magnitude of the DC voltage according to this invention.

Electrode Loading Effect:

For a conventional FBAR, the resonant frequency is also affected by loading of additional material to the top electrode. When a given amount of material is added to the top electrode, the mass of the added material causes a loading effect and leads to a decrease or change in resonant frequency $\Delta f$ from the original resonant frequency $f_o$ without the added material. The change of resonant frequency $\Delta f$ due to this loading effect in an FBAR has been used to monitor trace of material such as protein added to the top electrode. Results on the shift of resonant frequency with BSA protein loading on an AlN solidly mounted FBAR or SMFBAR have been described by L. García-Gancedo et al in an article "AlN-based BAW resonators with CNT electrodes for gravimetric biosensing" (2011 Sensors and Actuators B, volume 160, p. 1386-p. 1393). The initial resonant frequency of the FBAR is 1.75 GHz. In FIG. 11 of the above reference, the shift of resonant frequency with the BSA protein loading is shown to be essentially linear with the added mass, with the magnitude of M varies with the increase in the loading mass, having a sensitivity of 0.15 MHz per 1 ng/cm$^2$ of BSA loading. It is noted that the loading effects on the change of resonant frequencies of the conventional FBARs are due to physically added materials of different masses onto the top electrode of the FBARs. Certain effects on the resonant frequency may occur by adding masses to the bottom electrode, but data on this effect has not been identified in the literatures.

According to another embodiment of this invention, when the resonant properties of FBARs, SMRs or SMBARs containing semiconductor piezoelectric layer are tuned and adjusted by applying and varying a DC voltage, a depletion region and a neutral region are created in the semiconducting piezoelectric layer. The depletion region thickness is determined by the doping level and the DC voltage value whereas the neutral region thickness is determined by the total semiconducting piezoelectric layer thickness, doping level and the DC voltage value. The depletion region is intrinsic with very low density of free carriers, electrically insulating and constitutes an active piezoelectric layer which provides the first contribution to determine the resonant frequencies of the FBARs, SMRs, SMBARs as described previously. When a change in the neutral region thickness is introduced by variation of the biasing DC voltage, there is an associated change in the loading effect together with the electrodes, especially the top electrode. This will add a second contribution to affect the resonant frequencies. This second contribution due to the presence of the neutral region is affected by the neutral region thickness. Therefore, the resonant frequencies of FBARs, SMRs, SMBARs and filters, switches and other microwave devices according to this invention are advantageously tuned and adjusted by varying a DC voltage. The devices including filters formed are microwave acoustic devices or filters. To simplify the explanation, the terms FBAR will be used to represent also SMRs and SMBARs in subsequent description of this invention.

Effect of Conductivity on the Acoustic Wave Velocity:

Another effect related to the invention is the effect of conductivity of substrate. The effect of conductivity on the acoustic wave velocity has been reported in an article titled "Anomalous increase of SAW velocity due to conducting film on piezoelectric structure" by B. D. Zaitsev et al (2000 IEEE Ultrasonics Symposium p. 449-p. 452). It was shown that the acoustic wave velocity in the piezoelectric substrate is affected by the conductivity of a semiconducting film placed adjacent to the piezoelectric substrate. For the semiconductor layer with at low conductivity, the acoustic wave velocity remain the same and the effect of the semiconductor layer is minimal. For a semiconductor layer with an intermediate conductivity, the acoustic wave velocity decreases to a new value. When a semiconductor layer with a high conductivity is placed adjacent to the piezoelectric substrate, the acoustic wave velocity decreases to a low but constant value.

In the present invention, semiconducting piezoelectric layers are adopted for form resonators for microwave filters. Therefore, as the electrical conductivity of the semiconductor layer varies, the central frequency of resonance of an acoustic resonator or a filter will change. It is noted that the change of frequency ranges from a fraction of a percent to more than 25 percents, depending on the material of the piezoelectric layer. It should be noted that the variation of conductivity in the work by B. D. Zaitsev et al as cited above takes place in semiconducting thin layer placed adjacent to the piezoelectric substrate. Therefore the coupling effects are less strong and a change in the conductivity can be obtained by replacing a new semiconducting thin layer. In the present invention, semiconducting piezoelectric layers are adopted as a piezoelectric active layer and inactive conductive layers to effect a decrease of acoustic wave velocity.

According to one other embodiment of this invention, when the resonant properties of FBARs are tuned and adjusted by applying and varying a DC voltage to change the depletion region thickness of a semiconducting piezoelectric layer having a controlled doping, there is an associated change in the neutral region thickness. Since the velocity of acoustic waves in the electrically insulating depletion region is high and the velocity of acoustic waves in the electrically conducting neutral region is low, the depletion region form a part of the piezoelectric active layer and the neutral region form a part of loading. The average velocity of acoustic waves in the combined piezoelectric layer containing the piezoelectric depletion region and the piezoelectric neutral region therefore is tunable or controllable by controlling the relative value between the piezoelectric depletion region thickness and the piezoelectric neutral region thickness through the control of biasing DC voltages. The resonant frequencies of the present tunable FBARs containing semiconducting piezoelectric layers is further tuned or controlled due to the velocity effect of acoustic waves between the piezoelectric intrinsic (or depleted) region and piezoelectric neutral region. The devices including filters formed thus are microwave acoustic devices or filters based on piezoelectric semiconductor structures according to this invention.

From the above explanations, several embodiments of this invention related to tunable FBAR structures with central frequencies of resonance adjustable or tunable containing piezoelectric layers using materials with semiconducting properties will be provided herein. More specifically, they are related to junction properties associated with semiconducting piezoelectric structures. In a piezoelectric resonator, oscillator or a filter, the piezoelectric effects are mainly due to the exchange of electrical energy to mechanical energy in a piezoelectric active layer, where a strong electric field has been established due to the application of an electric voltage. In a semiconducting piezoelectric material incorporated in a junction device, which could be a P-N junction, a P-I-N junction, a M-I-N junction, or a M-I-P junction. Here P is a p-type doped piezoelectric semiconductor material, N is an n-type doped piezoelectric semiconductor material, I is the intrinsic un-doped piezoelectric semiconductor material, and M is a metal. When a voltage is applied, the electric field will occur mainly in the un-doped I layer and the depletion regions associated with the n-type doped piezoelectric material and/or the p-type doped piezoelectric semiconductor material. In the n-type piezoelectric material or the p-type piezoelectric material, there are neutral regions other than the depletion regions. In the depletion regions of the n-type doped or p-type doped piezoelectric semiconductors which are depleted of charge carriers, the electric resistivity is very large and could be more than $10^6$ ohm-cm. Whereas in the neutral regions, the resistivity is low and could be in a range from $10^{-4}$ ohm-cm to $10^2$ ohm-cm, depending on the doping concentration of impurities.

Due to the low resistivity or high conductivity, the neutral regions behave as a metal. They are in series connection with the depletion regions which have high resistivity values. When a voltage is applied across the series combination of the depletion region and the neutral region of a semiconducting piezoelectric material, the electric filed percentage in the neutral region is very small whereas the electric field percentage in the depletion is very large. Therefore, according to this invention, when a p-type doped or n-type doped semiconducting piezoelectric material is adopted in a FBAR or a filter, the interaction between the applied electric energy and the generated mechanical energy or acoustic waves will take place within the depletion region and not in the neutral region. The tunable FBARs to be provided in this invention advantageously employ the above characteristic of doped p-type or doped n-type semiconducting piezoelectric materials to implement frequency tuning and adjustment by a biasing DC voltage.

Tunable $M_1DM_2$ or MDM Resonators and Microwave Filters:

Some embodiments of this invention will be described using specific tunable resonator structures. According to one embodiment of this invention, a tunable MDM film bulk acoustic resonator (or TFBAR) for forming a tunable microwave acoustic filter for microwave communication units is provided. In addition to the microwave acoustic filters, such MDM TFBARs are also suitable for microwave acoustic switches and other microwave devices.

Figure 2A:
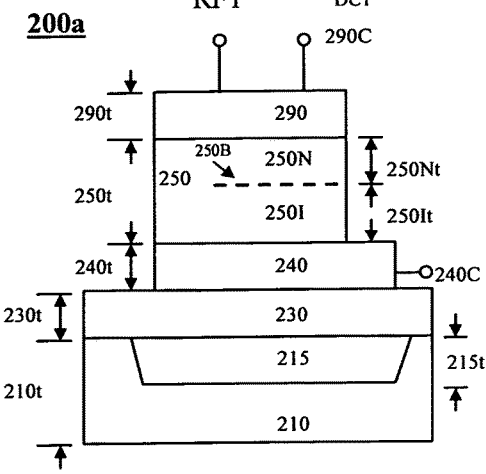
FIG. 2A is a schematic cross-sectional diagram of a TFBAR (200a) with MDM structure, to effect resonant at a first frequency $f_{o1}$ which is tunable by the DC biasing voltage, according to this invention.

FIG. 2A shows a schematic cross-sectional diagram describing a tunable film bulk acoustic resonator TFBAR (200*a*) in an $M_1D_1M_2$ structure according to this invention. Here, $M_1$ is a first metal, $D_1$ is a p-type doped or n-type doped first piezoelectric semiconductor and $M_2$ is a second metal. The TFBAR (200*a*) comprises a substrate (210) with a substrate thickness (210*t*); an acoustic wave isolation region (215) with an acoustic wave isolation region thickness (215*t*); a bottom support membrane (230) of a bottom support membrane material with a bottom support membrane thickness (230*t*); a bottom electrode (240, $M_2$) of a bottom electrode material an a bottom electrode thickness (240*t*); a first piezoelectric layer (250, $D_1$) with a first piezoelectric layer thickness (250*t*); and a top electrode (290, $M_1$) of a top electrode material with a top electrode thickness (290*t*).

The materials for the substrate is selected from a material groups: Si, GaAs, glass, sapphire, AlN, $Al_2O_3$ as long as they have sufficiently high electrical resistivity, sufficient thermal conductivity and flat surfaces. The acoustic wave isolation region (215) could be a thin film reflector stack with a plurality of alternating high impedance layers and low impedance layers each with a quarter wavelength thickness: $\lambda/4$, $\lambda$ being the wavelength of acoustic waves in the respective reflector layer. It could also be an air cavity with an acoustic wave isolation region thickness (215*t*).

The bottom support membrane thickness (230*t*) is preferably selected in a range of 50 nm to 500 nm and material of the bottom support membrane (230) is selected from a group including: silicon oxide ($SiO_2$), silicon nitride ($Si_3N_4$), silicon oxynitrides and their combinations to effect temperature compensation of the first piezoelectric layer (250) and to reduce unwanted shift of resonant frequency $f_{o1}$ with the temperature variation during operation. According to another embodiment of this invention, a protective layer (not shown in FIG. 2A) can be adopted to further stabilize the resonant frequency of the TFBAR (200*a*).

The top electrode thickness (290*t*) and the bottom electrode thickness (240*t*) are selected to be in a range of 50 nm to 2 μm, dependent on the frequency of resonant required and the loading effect acceptable. Materials for the bottom electrode and the top electrode are selected from a material group: W, Pt, Mo, Al, Ta, Ti, Cu, Cr, Au, Ru, Ir and their combinations.

The first piezoelectric layer (250, $D_1$) is a doped and partly electrically conducting semiconductor, which may be n-type or p-type and preferably n-type. The first piezoelectric layer (250) has a first piezoelectric layer depletion region (250I) of a thickness (250It) and a first piezoelectric neutral region (250N) of a thickness (250Nt), divided by a first piezoelectric depletion region edge (250B). The first piezoelectric layer depletion region (250I) is intrinsic and electrically insulating. The position of the first piezoelectric depletion region edge (250B) is controlled by a first DC voltage having a first voltage value $V_{DC1}$ applied between the bottom electrode (240) and the top electrode (290). The first DC voltage $V_{DC1}$ applied between the top electrode (290) through a top electrode contact (290C) and bottom electrode (240) through a bottom electrode contact (240C) is to bias the first piezoelectric layer (250) and to control the first piezoelectric layer depletion region thickness (250It) and the first piezoelectric layer neutral region thickness (250Nt), which leads to the control of the resonant frequency of the TFBAR (200a), to facilitate transmission or blocking of a first RF1 signal being applied to the top electrode (290).

Voltage value of the first DC voltage $V_{DC1}$ maybe increased or decreased to produce a new resonant frequency $f'_{o1}$ which could be the transmit frequency or receive frequency in the same band or transmit frequency or receive frequency in other band.

It should be mentioned that the formation of the first piezoelectric layer depletion region (250I) and the first piezoelectric neutral region (250N) are similar to that in semiconductors like Si and GaAs used in microelectronic chips, the principles and theory have been described in various text books and literatures and will not be repeated here. In the depletion regions of the piezoelectric semiconductor, the charge carrier density is small and below $10^{10}$ $cm^{-3}$, so the electrical conductivity is very low and the depletion region behaves as an insulator, whereas in the neutral region the carrier density is large and normally in a range of $10^{14}$ to $10^{21}$ $cm^{-3}$ so the electrical conductivity is large and the neutral region behaves as a conductor.

The doping level of the first piezoelectric layer (250) is preferably controlled to have an impurity concentration in a range of $10^{14}$ $cm^{-3}$ to $10^{22}$ $cm^{-3}$ and it is more preferably controlled to be in the range of $10^{16}$ to $10^{20}$ $cm^{-3}$ to enhance the sensitivity of the first DC voltage ($V_{DC1}$) on controlling of the first piezoelectric layer depletion region thickness (250It) and hence the sensitivity of control of resonant frequency. In TFBAR (200a), the first piezoelectric layer depletion region (250I) forms a first piezoelectric active layer. The first piezoelectric layer depletion region (250I) and the first piezoelectric neutral region (250N) can achieve resonant of the TFBAR (200a) at a first frequency $f_{o1}$ when a first RF signal RF1 at the first frequency $f_{o1}$ is applied to the top electrode (290). The first piezoelectric layer thickness (250t) is selected in a range of 50 nm to 20 μm, dependent on the acoustic wave velocity in the first piezoelectric layer (250) and the first frequency $f_{o1}$ of resonant required for the application. For given frequencies of operation, the first piezoelectric layer thickness (250t) should be selected so that when the maximum first DC voltage $V_{DC1}$ is applied to get the maximum first piezoelectric layer depletion region thickness (250It), the first piezoelectric layer neutral region thickness (250Nt) should be minimum, preferably close to zero so that unwanted loss of acoustic waves energy in the first piezoelectric layer neutral region is minimum.

Material of the first piezoelectric layer is selected from a compound material group including: AlN, GaN, AlGaN, ZnO, GaAs, AlAs, AlGaAs as long as they are piezoelectric with sufficient acoustic coupling coefficients and are semiconducting and can be doped to p-type and/or n-type conduction.

When a plurality of the film bulk acoustic resonators (200a) are connected into a ladder filter or a lattice filter, and connected with other passive components such as capacitors and inductors, a narrow band pass characteristic is achieved to allow the transmission of a first RF1 signal at a first frequency $f_{o1}$ with a first bandwidth BW1, which could be a receive frequency or a transmit frequency for a given communication band. RF signals at frequencies other than $f_{o1}$ and outside BW1 are not allowed to pass through.

It is obvious that by reversing the first DC voltage $V_{DC1}$ and interchanging the bottom electrode (240) with the top electrode (290), the first piezoelectric layer depletion region (250I) will be adjacent to and in direct contact with the bottom electrode, whereas the first piezoelectric layer neutral region (250N) will be on top of the first piezoelectric layer depletion region (250I) and in direct contact with the top electrode, a TFBAR with the inverted $V_{DC1}$ and interchanged electrodes has same resonant characteristics as that before the inversion.

Therefore, according to this invention, the resonant properties of the $M_1D_1M_2$ or MDM structure of TFBAR (200a) is tunable by varying the first DC biasing voltage $V_{DC1}$. When the first DC biasing voltage $V_{DC1}$ is varied, both the first piezoelectric layer depletion region thickness (250It) and the first piezoelectric layer neutral region thickness (250Nt) will change. The change in the first piezoelectric layer depletion region thickness (250It) changes the first piezoelectric active layer (250I) and produces a first change component in the resonant frequency. On the other hand, the change in the first piezoelectric layer neutral region thickness (250Nt) changes the loading effect and the velocity effect and produces a second change component in the resonant frequency. Hence, the resonant frequency and properties of the MDM TFBAR (200a) changes with the variation of the first DC biasing voltage $V_{DC1}$.

The change in the first piezoelectric layer depletion region thickness (250It) by varying the first DC voltage $V_{DC1}$ is thus used in this invention to control resonant frequency of the MDM TFBAR (200a) in this invention. In the case that a plurality of MDM TFBARs (200a) are connected into a ladder filter or a lattice filter having a narrow band pass characteristic to allow the transmission of an RF signal at a frequency $f_{o1}$, a plurality of first DC voltage values: $V_{DC1-1}$, $V_{DC1-2}$, - - - $V_{DC1-N}$, may be applied one at a time to produce a plurality of resonant frequencies: $f_{o1-1}$, $f_{o1-2}$, - - - $f_{o1-N}$ for transmit frequency or receive frequency of a band or other bands. As the formation of the first piezoelectric layer depletion region is due to evacuation of majority carriers, the switching from one resonant frequency to other frequencies is fast and only limited by the RC time constant of the TFBAR.

Tunable $M_1D_1I_1M_2$ or MDIM Resonators and Filters:

According to one other embodiment of this invention, a tunable $M_1D_1I_1M_2$ or MDIM film bulk acoustic resonator for forming a tunable microwave acoustic filters for microwave communication units is provided. In addition to the microwave acoustic filters, such MDIM TFBARs are also suited for microwave acoustic switches and other microwave devices.

Figure 2B:
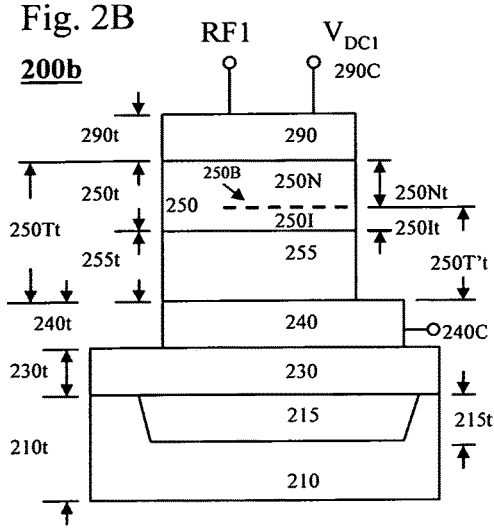
FIG. 2B is a schematic cross-sectional diagram showing a TFBAR (200b) with MDIM structure to effect resonant at a first frequency $f_{o1}$ which is tunable by the DC biasing voltage, according to this invention.

In FIG. 2B, a schematic cross-sectional diagram of a tunable film bulk acoustic resonator TFBAR (200b), in an $M_1D_1I_1M_2$ or MDIM form according to this invention is shown. Here $M_1$ is a first metal, $D_1$ is a p-type doped or n-type doped first piezoelectric semiconductor, $I_1$ is an un-doped second piezoelectric layer and $M_2$ is a second metal. TFBAR (200b) comprises a substrate (210) with a substrate thickness (210t); an acoustic wave isolation region (215) with an acoustic wave isolation region thickness (215t); a bottom support membrane (230) with a bottom support membrane thickness (230t); a bottom electrode (240, $M_2$) with a bottom electrode thickness (240t); an un-doped second piezoelectric layer (255, $I_1$) with a second piezoelectric layer thickness (255t) contacting the bottom electrode (240); a partly electrically conductive first piezoelectric layer (250, $D_1$) with a first piezoelectric layer thickness (250t); and a top electrode (290) with a top electrode thickness (290t). The first and the second piezoelectric layers (250, 255) form a first combined piezoelectric layer (255+250) with a first combined piezoelectric layer thickness (250Tt). The TFBAR (200b) thus forms a $M_1D_1I_1M_2$ or a MDIM structure of RF resonator.

The materials for the substrate is selected from a material groups: Si, GaAs, glass, sapphire, AlN, $Al_2O_3$ as long as they have sufficiently high electrical resistivity, sufficient thermal conductivity and flat surfaces. The acoustic wave isolation region (215) could be a thin film reflector stack with a plurality of alternating high impedance layers and low impedance layers each with a quarter wavelength thickness: $\lambda/4$, $\lambda$, being the wavelength of acoustic waves in respective reflector layer, or an air cavity with an acoustic wave isolation region thickness (215t).

The bottom support membrane thickness (230t) is preferably selected in a range of 50 nm to 500 nm and material of the bottom support membrane (230) is selected from a group including: silicon oxide ($SiO_2$), silicon nitride ($Si_3N_4$), silicon oxynitrides and their combinations to effect temperature compensation and to reduce unwanted shift of resonant frequency $f_{o1}$ with the temperature variation during operation. According to another embodiment of this invention, a protective layer (not shown in FIG. 2B) can be adopted to further stabilize the resonant frequency of the TFBAR (200b). The top electrode thickness (290t) and the bottom electrode thickness (240t) are selected to be in a range of 50 nm to 2 μm, dependent on the frequency of resonant required and the loading effect acceptable. Materials for the bottom electrode and the top electrode are selected from a material group: W, Pt, Mo, Al, Ta, Ti, Cu, Cr, Au, Ru, Ir and their combinations.

The first piezoelectric layer (250) is a doped semiconductor which may be n-type or p-type and preferably to be n-type. The second piezoelectric layer (255) is not intentionally doped and it is intrinsic and electrically insulating. The first piezoelectric layer (250) has a first piezoelectric layer depletion region (250I) with a first piezoelectric layer depletion region thickness (250It) and a first piezoelectric layer neutral region (250N) with a first piezoelectric layer neutral region thickness (250Nt), defining a first piezoelectric depletion region edge (250B). The first piezoelectric layer depletion region (250I) is intrinsic and electrically insulating. The position of the first piezoelectric depletion region edge (250B) is controlled by a first DC voltage having a first voltage value $V_{DC1}$ applied between the bottom electrode (240) and the top electrode (290). The first piezoelectric layer depletion region (250I) and the second piezoelectric layer (255) form a first combined piezoelectric active layer (255+250I) having a first combined piezoelectric active layer thickness (250T't), to effect resonant of the TFBAR (200b) at a first frequency $f_{o1}$ and a plurality of other resonant frequencies when a first RF signal RF1 at the first frequency $f_{o1}$ is applied to the top electrode (290). The first DC voltage $V_{DC1}$ is applied between the top electrode (290) through a top electrode contact (290C) and bottom electrode (240) through a bottom electrode contact (240C) to bias the first combined piezoelectric layer (250+255). This will control the first piezoelectric layer depletion region thickness (250It) and the first piezoelectric layer neutral region thickness (250Nt), hence controls the combined piezoelectric active layer thickness (250T't) and leads to the control of resonant frequency of the TFBAR (200b), to facilitate transmission or blocking of a first RF1 signal being applied to the top electrode (290).

The doping level of the first piezoelectric layer (250) is preferably controlled to be in an impurity concentration range of $10^{14}$ $cm^{-3}$ to $10^{22}$ $cm^{-3}$ and is more preferably controlled to be in a range of $10^{16}$ to $10^{20}$ $cm^{-3}$ to control the sensitivity of the first DC voltage $V_{DC1}$ on controlling of the first piezoelectric layer depletion region thickness (250It) and hence the sensitivity of control of the resonant frequency.

The first piezoelectric layer thickness (250t) is selected to be in a range of 50 nm to 20 μm, dependent on the acoustic wave velocity in the first piezoelectric layer (250) and the first frequency $f_{o1}$ of resonant required for the application. The second piezoelectric layer thickness (255t) is selected in a range of 50 nm to 20 μm dependent on the acoustic wave velocity in the second piezoelectric layer and the first frequency $f_{o1}$ and a plurality of other frequencies of resonant required for the applications. For given frequencies of operation, the first piezoelectric layer thickness (250t) should be selected so that when the maximum first DC voltage $V_{DC1}$ is applied to get the maximum first piezoelectric layer depletion region thickness (250It), the first piezoelectric layer neutral region thickness (250Nt) should be minimum, preferably close to zero so that unwanted loss of acoustic waves energy in the first piezoelectric layer neutral region (250N) is minimum.

Material of the first piezoelectric layer (250) is selected from a compound material group including: AlN, GaN, AlGaN, ZnO, GaAs, AlAs, AlGaAs as long as they are piezoelectric with sufficient acoustic-electric coupling coefficients and are semiconducting and can be doped to p-type and/or n-type conduction. Material of the second piezoelectric layer (255) is selected from a compound material group including: AlN, GaN, AlGaN, ZnO, GaAs, AlAs, AlGaAs, $LiNbO_3$, PZT, $BaTiO_3$, quartz and $KNbO_3$ as long as they are piezoelectric with sufficiently large acoustic-electric coupling coefficients and are compatible to the first piezoelectric layer (250).

Voltage value of the first DC voltage $V_{DC1}$ maybe increased or decreased to produce a new resonant frequency $f'_{o1}$ which could be the transmit frequency or receive frequency in the same band or transmit frequency or receive frequency in other band. Therefore, according to this invention, the resonant properties of the MDIM is tunable by varying the first DC biasing voltage $V_{DC1}$. When the first DC biasing voltage is varied, both the first piezoelectric layer depletion region thickness (250It) and the first piezoelectric layer neutral region thickness (250Nt) will change. The change in the first piezoelectric layer depletion region thickness (250It) changes the first combined piezoelectric active layer thickness (255t+250It) or (250T't) and produce a first change component in the resonant frequency. On the other hand, the change in the first piezoelectric layer neutral region thickness (250Nt) changes the loading effect and the velocity effect and produces a second change component in the resonant frequency. Hence, the resonant frequency and properties of the MDIM TFBAR is tunable with the variation of the first DC biasing voltage $V_{DC1}$.

It is thus clear that a plurality of first DC voltage values: $V_{DC1-1}$, $V_{DC1-2}$, - - - $V_{DC1-N}$, may be applied one at a time to produce a plurality of resonant frequencies: $f_{o1-1}$, $f_{o1-2}$, - - - $f_{o1-N}$ for transmit frequency or receive frequency of a band or other bands. As the formation of the first piezoelectric layer depletion region is due to evacuation of majority carriers, the switching from one resonant frequency to the other frequency is fast and only limited by the RC time constant of the TFBAR. The tunable MDIM TFBAR may be used in a tunable filter and an oscillator for microwave applications.

When a plurality of the tunable film bulk acoustic resonators (200b) are connected into a ladder filter or a lattice filter and connected with other passive components such as capacitors and inductors, a narrow band pass characteristic is achieved to allow the transmission of a first RF1 signal at a first frequency $f_{o1}$ with a first bandwidth BW1, which could be a receive frequency or transmit frequency for a given communication band. RF signals at frequencies other than $f_{o1}$ and outside BW1 are not allowed to pass through. The change in the first piezoelectric layer depletion region thickness (250It) and the associated change in the first piezoelectric layer neutral region thickness (250Nt) by varying the first DC biasing voltage are thus used in this invention to control resonant frequency of the MDIM TFBAR in this invention.

Figure 2C:
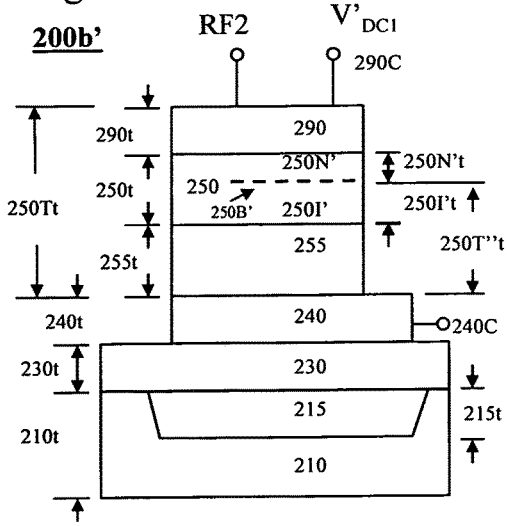
FIG. 2C is a schematic cross-sectional diagram showing the MDIM TFBAR (200b) in FIG. 2B under a different DC biasing voltage $V'_{DC1}$, to demonstrate effect of the first DC voltage.

In order to explain the effect of first DC voltage according to this invention, FIG. 2C shows a schematic cross-sectional diagram of MDIM TFBAR (200b'), which illustrates TFBAR (200b, in FIG. 2B) at a new bias DC voltage $V'_{DC1}$.

When a first DC voltage $V'_{DC1}$ with a more positive value than the first voltage value $V_{DC1}$ in FIG. 2B is applied between the top electrode (290) and the bottom electrode (240) to bias the first combined piezoelectric layer (255+ 250) and to change the first piezoelectric layer depletion region thickness to a new value (250I't) and the first piezoelectric layer neutral region thickness to a new value (250N't), defining a new first piezoelectric depletion region edge (250B'). The new first piezoelectric layer depletion region (250I') and the new second piezoelectric layer (255) form a new first combined piezoelectric active layer (255+ 250I') having a first combined piezoelectric active layer thickness (250T"t). This change in the combined piezoelectric active layer thickness (250T"t) leads to the change of the resonant frequency of TFBAR (200b') to a second frequency $f_{o2}$, to facilitate transmission or blocking of a second RF2 signal being applied to the top electrode (290).

When a plurality of tunable film bulk acoustic resonators (200c) are connected into a ladder filter or a lattice filter, a narrow band pass characteristic is achieved to allow the transmission of a second RF2 signal at a second frequency $f_{o2}$ with a second bandwidth BW2, which could be a transmit frequency or a receive frequency for a given communication band, or a transmit frequency or receive frequency of the other band, whereas RF signals at frequencies other than $f_{o2}$ and outside BW2 are not allowed to pass through.

According to this invention, the resonant properties of the MDIM (200b') is tunable by varying the first DC biasing voltage $V'_{DC1}$. When the first DC biasing voltage $V'_{DC1}$ is varied, both the first piezoelectric layer depletion region thickness (250I't) and the first piezoelectric layer neutral region thickness (250N't) will change. This change in the first piezoelectric layer depletion region thickness (250I't) changes the first combined piezoelectric active layer thickness (250T"t) to effect the first change component in the resonant frequency. It also produces a first change component in the first piezoelectric layer neutral region thickness (250N't), which changes the loading effect and the velocity effect and produces a second change component in the resonant frequency. Hence, the resonant properties of the MDIM TFBAR (200b') changes with the variation of the first DC biasing voltage $V'_{DC1}$ to effect a change in resonant frequency and properties.

According to this invention, a plurality of first DC voltage values: $V'_{DC1-1}$, $V'_{DC1-2}$, - - - $V'_{DC1-N}$, may be applied one at a time to produce a plurality of resonant frequencies: $f_{o2-1}$, $f_{o2-2}$, - - - $f_{o2-N}$ for transmit frequency or receive frequency of a band or other bands. As the formation of the first piezoelectric layer depletion region is due to evacuation of major carriers, the switching from one resonant frequency to the other frequency is fast and limited by the RC time constant of the TFBAR. The tunable MDIM TFBAR may be used in a tunable filter and an oscillator for microwave applications.

When a plurality of said MDIM TFBARs (200b') are connected into a ladder filter or a lattice filter, a narrow band pass characteristic is achieved to allow the transmission of RF signals. The change in the first piezoelectric layer depletion region thickness and the associated change in the first piezoelectric layer neutral region thickness by varying the first DC biasing voltage are thus used in this invention to control resonant frequency of the MDIM TFBAR in this invention.

Figure 2D:
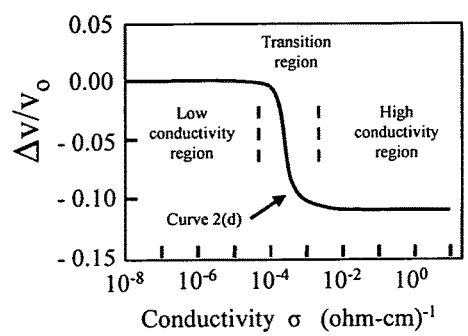
FIG. 2D is a diagram showing variation of $\Delta v/v_o$ with electrical conductivity $\sigma$ of a piezoelectric semiconductor substrate. The change in acoustic wave velocity $v(\sigma)$ with the electrical conductivity is controlled by the biasing DC voltage according to this invention.
Figure 2E:
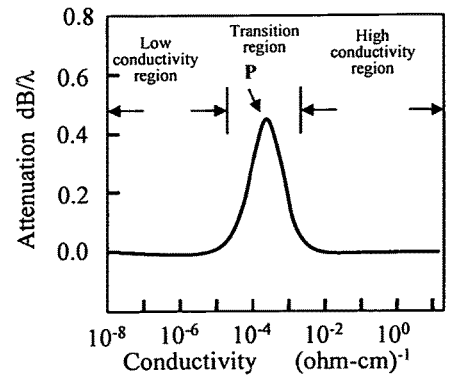
FIG. 2E shows the variation of acoustic wave attenuation versus conductivity of the piezoelectric semiconductor. The attenuation is small in the low conductivity region and the high conductivity region and it is large in the transition region.

FIG. 2D shows variations of $\Delta v/v_o$ with electrical conductivity σ of a piezoelectric semiconductor substrate. Here, $\Delta v = v(\sigma) - v_o$. The term v(σ) represents acoustic wave velocity in the piezoelectric semiconductor substrate or substrate at a given conductivity σ and $v_o$ is the acoustic wave velocity in the substrate when σ=0. When the substrate has a conductivity in the low conductivity region, $\Delta v/v_o$=0 and the attenuation of the acoustic waves is minimum (as shown in FIG. 2E). When the piezoelectric semiconductor substrate has a conductivity in the high conductivity region, the substrate behaves as metallic and v(σ) is less than $v_o$, so that $\Delta v/v_o$ is negative. The middle region in FIG. 2D is the transition region between the low conductivity region and the high conductivity region. The change in acoustic wave velocity v(σ) with the electrical conductivity σ is used in the embodiments of this invention to partly control or to tune the central resonant frequencies of TFBARs by applying and varying the biasing first DC voltages applied across to them.

FIG. 2E shows the variation of acoustic wave attenuation versus the conductivity σ of the first piezoelectric semiconductor substrate. In the low conductivity region, density of charge carriers is small, the attenuation of acoustic waves is minimum. In the high conductivity region, the substrate becomes metallic due to the large carrier density and the loss of acoustic waves is again minimum. In the transition region, $\Delta v/v_o$ decreases from 0 to negative values. Due to the presence of electrons and relatively low conductivity in the transition region, there is a loss of acoustic waves energy so that the attenuation is large compared to the low conductivity region and the high conductivity region. The maximum attenuation of acoustic energy occurs at point P.

Figure 2F:
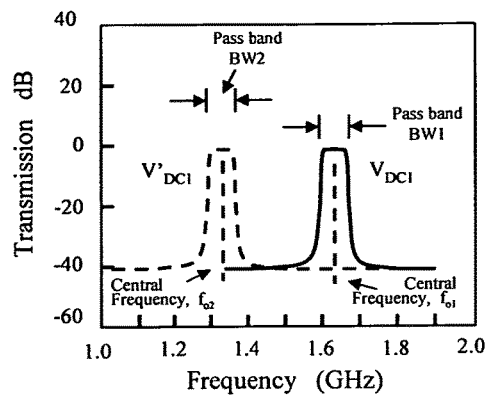
FIG. 2F illustrates transmission characteristics of a tunable microwave filter formed with a plurality of the TFBARs (either 200a or 200b), showing a shift of central frequency of microwave transmission from $f_{o1}$ to $f_{o2}$, when the first DC voltage is changed from $V_{DC1}$ to $V'_{DC1}$.

When a plurality of the TFBARs (200a, 200b, 200b' in FIGS. 2A, 2B and 2C) according to this invention are adopted and connected to form a tunable filter for microwaves filtering (such as the ones to be given in FIGS. 5C and 5D), transmission of microwaves will be characterized by a first central frequency $f_{o1}$ and a first pass bandwidth BW1 as shown by the solid curve in FIG. 2F. When a first DC bias voltage $V_{DC1}$ is applied across the top electrode (290) and bottom electrode (240) of the TFBAR shown in FIG. 2B, a first piezoelectric layer depletion region (250I) with a thickness (250It) and a first combined piezoelectric active layer thickness (255t+250It) are formed. When a first DC voltage of a new value $V'_{DC1}$ which is more positive than $V_{DC1}$ is applied (see FIG. 2C), the first piezoelectric layer depletion region widens to form a new intrinsic first piezoelectric layer depletion region (250I') with a new thickness (250I't) which is greater than the original first piezoelectric layer depletion region thickness (250It) when the first DC voltage $V_{DC1}$ was applied. The increased new first piezoelectric layer depletion region thickness (250I't) results in an increased first combined piezoelectric active layer thickness to cause a shift of the central frequency of microwave transmission from $f_{o1}$ to $f_{o2}$, as shown by the dashed curve with a pass bandwidth BW2 on the left, forming a microwave filter adjustable or tunable by the first DC bias voltages: $V_{DC1}$, $V'_{DC1}$.

Figure 3A:
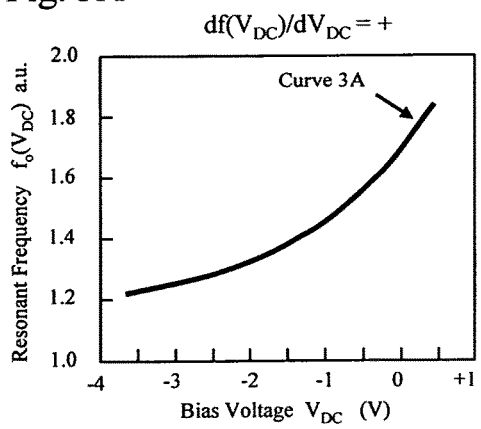
FIG. 3A shows variation of the central resonant frequency $f_o$ with a DC bias voltage (Curve 3A) of a tunable microwave filter without considering the variations of loading effect due to the variation of first piezoelectric layer neutral region thickness and the difference in acoustic wave velocity. So that $df_o(V_{DC})/dV_{DC}$ is positive.
Figure 5A:
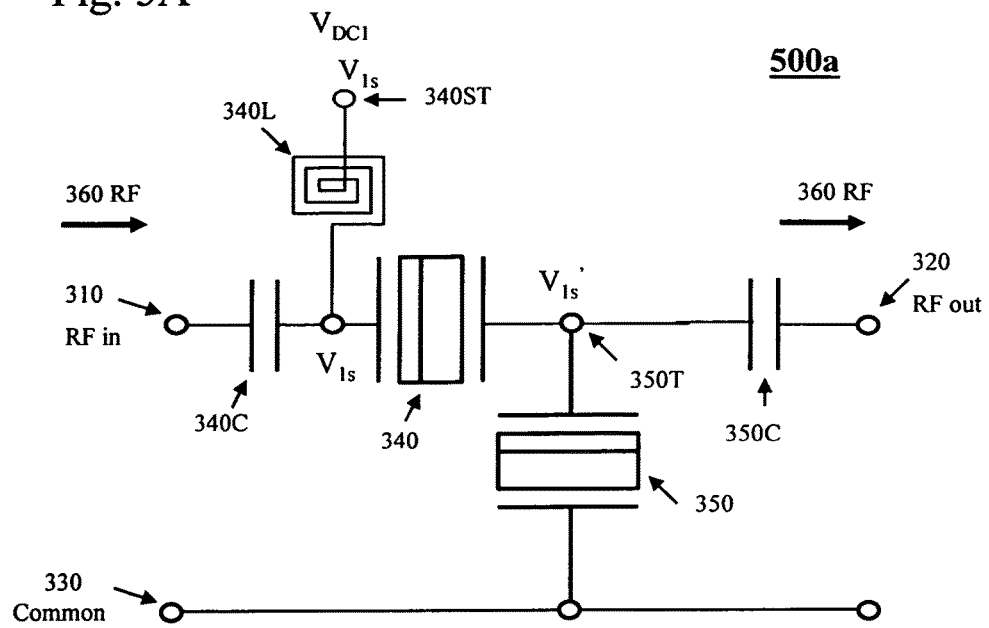
FIG. 5A shows a schematic diagram of a tunable microwave filter circuit (500a) formed by connecting two TFBAR resonators (340, 350) according to this invention. It comprises a first series resonator, a second parallel resonator, a first coupling capacitor, a second coupling capacitor, a first isolation inductor. A first DC voltage source $V_{DC1}$ is used to establish biasing of the first series resonator and second parallel resonator and to control the central frequency of resonant $f_{o1}$ of the filter (500a).
Figure 5B:
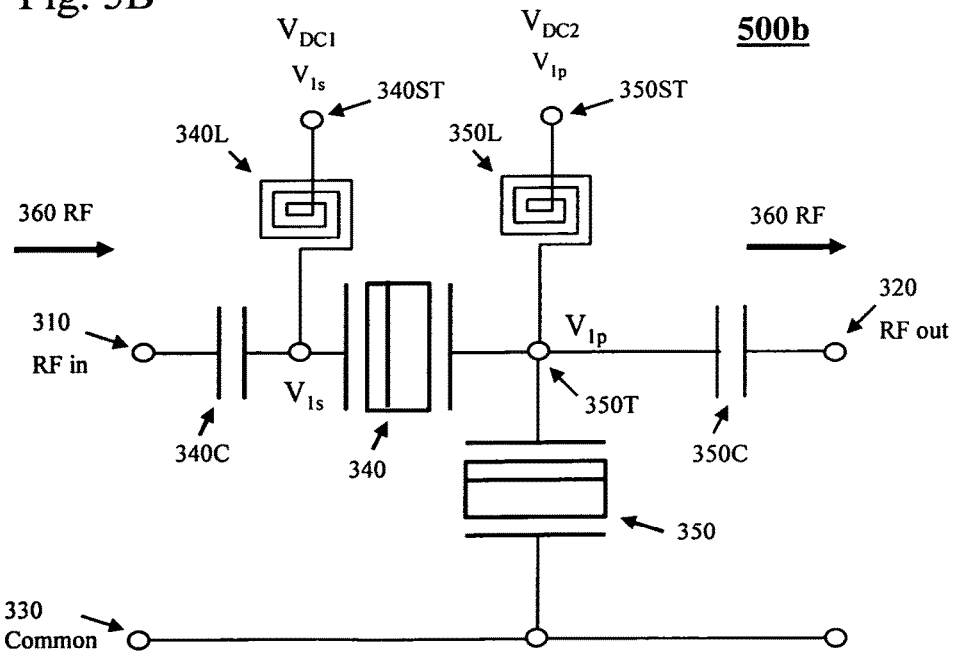
FIG. 5B shows a schematic diagram of a tunable microwave filter circuit (500b) formed by connecting two TFBAR resonators (340, 350) according to this invention. It comprises a first series resonator, a second parallel resonator or shunt resonator, a first coupling capacitor, a second coupling capacitor, a first isolation inductor, a second isolation inductor. A first DC voltage source $V_{DC1}$ and a second DC voltage source $V_{DC2}$ are applied to establish biasing and to control the central frequency of the filter (500b).
Figure 5C:
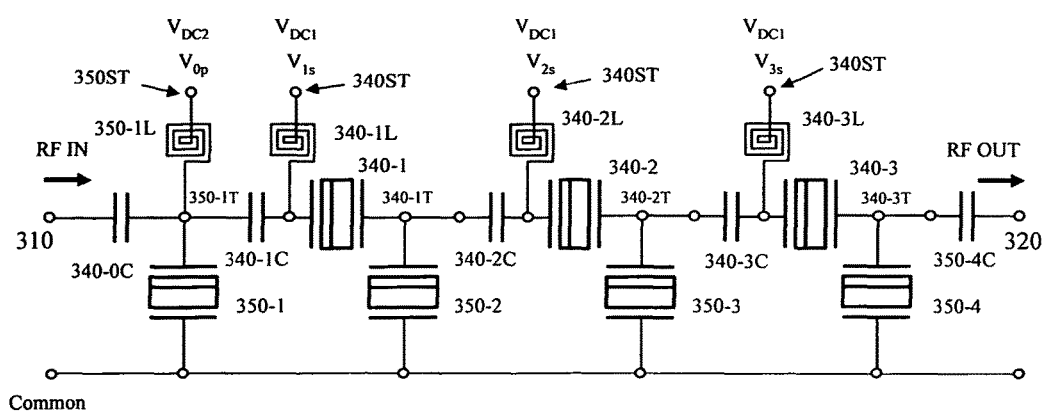
FIG. 5C shows a schematic diagram of a 3½ stage ladder tunable microwave acoustic filter (500c) according to this invention. It comprises a plurality of first series resonators, a plurality of second parallel resonators or shunt resonators, a plurality of first coupling capacitors, a second coupling capacitor, a plurality of first isolation inductors and a second isolation inductor. A first DC voltage source $V_{DC1}$ is applied to establish biasing and to control central frequency $f_{o1}$ of the filter (500c).
Figure 5D:
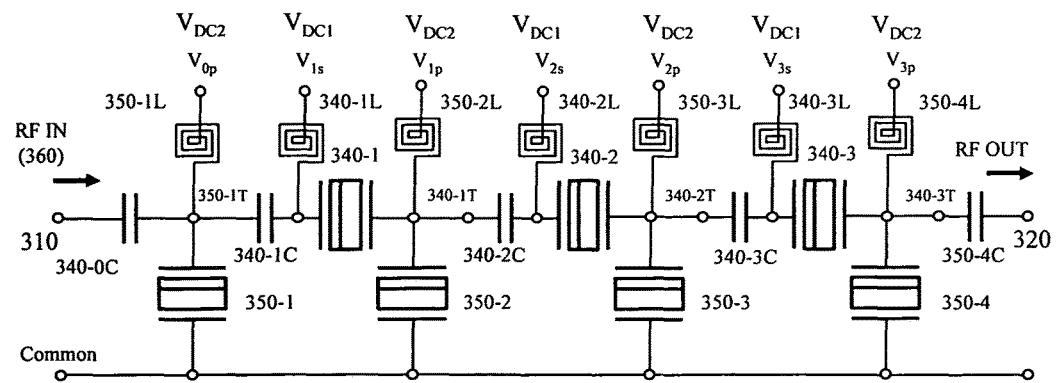
FIG. 5D shows a schematic diagram of a 3½ stage tunable ladder microwave acoustic filter (500d) according to this invention. It comprises a plurality of first series resonators, a plurality of second parallel resonators or shunt resonators, a plurality of first coupling capacitors, a second coupling capacitor, a plurality of first isolation inductors and a plurality of second isolation inductors. A first DC voltage source $V_{DC1}$ and a second DC voltage source $V_{DC2}$ are used to establish biasing and to control the central frequency $f_{o1}$ of transmission said filter (500d).

When considering only the effects the first piezoelectric layer depletion region thickness (250It or 250I/t) on the central resonant frequency $f_o$, the variation of $f_o$ with the first DC voltage $V_{DC}$ is given in FIG. 3A (Curve 3A) for a tunable microwave filter formed from a plurality of TFBARs shown in FIGS. 2B and 2C (such as the ones to be shown in FIGS. 5C and 5D). Without considering the consequence of variation in the loading effect due to the changing in the first piezoelectric layer neutral region thickness (250Nt or 250N't) and the difference between the acoustic wave velocity in the first piezoelectric layer neutral region and in the first piezoelectric layer depletion region, when a reverse $V_{DC}$ with a large magnitude is applied, the first piezoelectric layer depletion region thickness (250It or 250I't) is large and the central frequency $f_o$ of transmission or resonant frequency is low and the central frequency $f_o$ increases with the increase in $V_{DC}$ due to a decrease in the first combined active piezoelectric layer thickness (255t+250It or 255t+250I't). Therefore, the central frequency $f_o$ of transmission of the microwave filter formed by a plurality of TFBARs is tuned by the DC voltage $V_{DC}$ to provide different microwave transmission characteristics with different central resonant frequencies for communication applications. In Curve 3A, $f_o$ increases with the increase in $V_{DC}$ and $df_o(V_{DC})/dV_{DC}$ is positive.

Figure 3B:
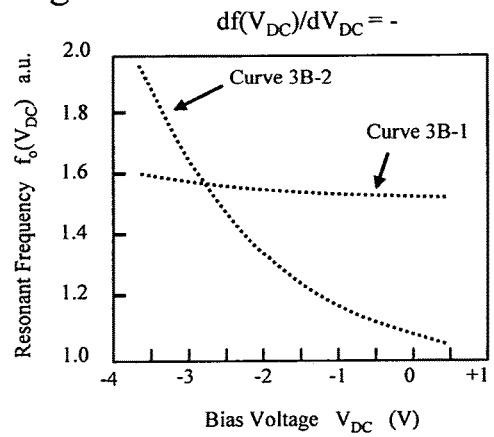
FIG. 3B shows the variation of the resonant frequency with the DC biasing voltage of a tunable microwave filter by considering only the effects of difference in acoustic wave velocities between the neutral region and the depletion region and the variation of loading, the variation of the resonant frequency with the DC biasing voltage is opposite to that shown in FIG. 3A. So that $df_o(V_{DC})/dV_{DC}$ is negative.

When considering only the consequence of the loading effects due to the variation of the first piezoelectric layer neutral region thickness and the acoustic wave velocity effect associated with changes in the first piezoelectric layer neutral region thickness, the variation of $f_o$ with the first DC voltage $V_{DC}$ is given in FIG. 3B by Curve 3B-1 and Curve 3B-2. By ignoring the contributions of the first change component in resonant frequency due to the variation of the first piezoelectric layer depletion region thickness hence the first combined piezoelectric active layer thickness due to the first DC voltage $V_{DC}$, the tendency of variation of $f_o$ with $V_{DC}$ is opposite to that of Curve 3A (FIG. 3A) and that described in the previous paragraph. In FIG. 3B, as $V_{DC}$ is increased, the first piezoelectric layer neutral region thickness increases. This increase leads to an increase in the loading effect associated with the top electrode and a decrease in average velocity of acoustic waves (see FIG. 2D). Therefore, the central resonant frequency $f_o$ decreases with the increase in $V_{DC}$. The rate of decrease in the central frequency $f_o$ with first DC biasing voltage $V_{DC}$ is determined by the degree of the above-mentioned effects. When the loading effect is not too strong and the velocity difference is not too large for certain combinations of piezoelectric materials, the decrease of the central frequency $f_o$ with the increase of DC biasing voltage $V_{DC}$ is gradual such as the case of Curve 3B-1 which shows a gradual decrease in $f_o$ due to a gradual increase in loading effect and a gradual decrease in average velocity of acoustic waves. Curve 3B-2 shows a faster decrease of central frequency $f_o$ with the increase in $V_{DC}$ due to a faster increase in loading effect arising from the increase in the first piezoelectric layer neutral region thickness and a more rapid decrease in average velocity of acoustic waves, for certain other combinations of piezoelectric materials. In Curves 3B-1 and 3B-2, $df_o(V_{DC})/dV_{DC}$ is negative.

When both the effects described in the previous paragraphs, namely (a) the effect of variation of the first piezoelectric layer depletion region on the central resonant frequency $f_o$ and (b) the effect of changes in loading effects and acoustic wave velocity associated with the changes in first piezoelectric layer neutral region are considered, the results of variation of $f_o$ of TFBAR with first DC voltage $V_{DC}$ will be closer to the reality.

Figure 3C:
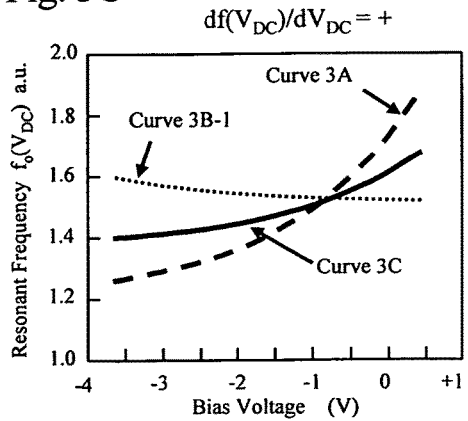
FIG. 3C shows the variation of the central resonant frequency with the DC biasing voltage of a tunable microwave filter. Curve 3C is obtained combining the effect of a decrease in piezoelectric active layer thickness with the DC biasing voltage (Curve 3A) and the moderate difference in acoustic wave velocities and the weaker loading effects represented by Curve 3B-1.

By considering the effect of increase of resonant frequency $f_o$ due to a decrease in the first combined piezoelectric active layer thickness with the DC biasing voltage (Curve 3A in FIG. 3A), and also a moderate difference in acoustic wave velocity in the first piezoelectric layer neutral region and in the first piezoelectric layer depletion region and a weaker loading effects (Curve 3B-1 in FIG. 3B), the overall effects of $V_{DC}$ variation on the variation of the central frequency $f_o$ is shown in FIG. 3C by Curve 3C. Here, $f_o(V_{DC})$ increases with the increase in $V_{DC}$ and $df_o(V_{DC})/dV_{DC}$ is positive.

Figure 3D:
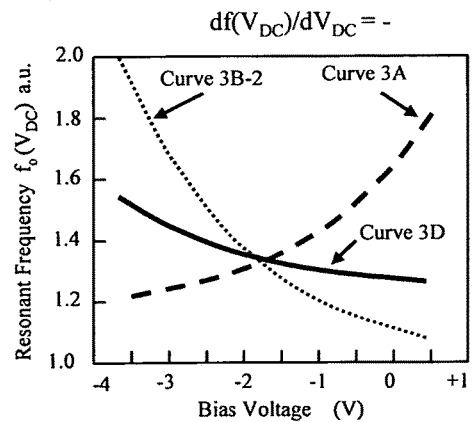
FIG. 3D shows the variation of the central resonant frequency with the DC biasing voltage of a tunable microwave filter. Curve 3D is obtained by combining the effect of increase of the first combined active piezoelectric layer thickness on the resonant frequency (Curve 3A) and the large difference in acoustic wave and a strong loading effect represented by Curve 3B-2.

FIG. 3D give another possible result when considering the effect of changes of the first combined active piezoelectric layer thickness on the resonant frequency (Curve 3A) and by considering the large difference in acoustic wave velocity in first piezoelectric layer neutral region and first piezoelectric layer depletion region, and a strong loading effect (Curve 3B-2), the overall effects of $V_{DC}$ variation on the variation of the central frequency $f_o$ is given by Curve 3D. In Curve 3D, $f_o(V_{DC})$ decreases with the increase in $V_{DC}$ and $df_o(V_{DC})/dV_{DC}$ is negative.

Several further embodiments according to this inventions involving tunable FBAR in a form of MIDM, MDIDM, MDDM, MDIDIDM are also provided here.

Tunable $M_1I_1D_1M_2$ or MIDM Resonators and Filters:

According to another embodiment of this invention, a tunable film bulk acoustic resonator (TFBAR) with $M_1I_1D_1M_2$ or MIDM structure for forming tunable microwave acoustic filters for microwave communication units is provided. Here $M_1$ is a first metal, $I_1$ is an un-doped second piezoelectric layer, $D_1$ is a p-type doped or n-type doped first piezoelectric semiconductor, and $M_2$ is a second metal. In addition to the microwave acoustic filters, such MIDM TFBARs are also suitable for microwave acoustic switches and other microwave devices.

Figure 4A:
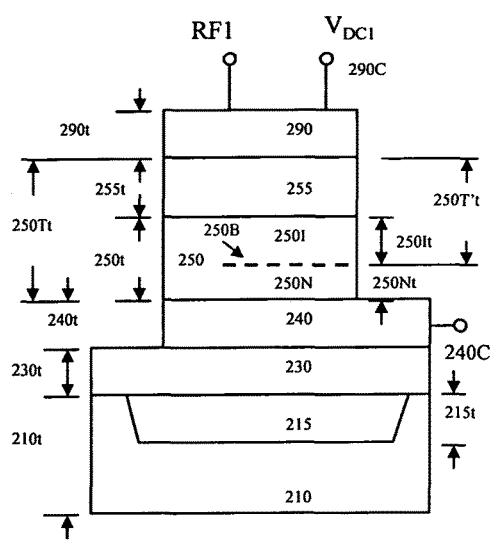
FIG. 4A is a schematic cross-sectional diagram showing a TFBAR (400a) with an MIDM structure to effect resonant at a first frequency $f_{o1}$ which is tunable by the DC biasing voltage $V_{DC1}$, according to this invention.

FIG. 4A shows a schematic cross-sectional diagram of such a TFBAR (400a) in an MIDM form. TFBAR (400a) comprises a substrate (210) with a substrate thickness (210t); an acoustic wave isolation region (215) with an acoustic wave isolation region thickness (215t); a bottom support membrane (230) with a bottom support membrane thickness (230t); a bottom electrode (240, $M_2$) with a bottom electrode thickness (240t); a doped and partly electrically conductive first piezoelectric layer (250, $D_1$) with a first piezoelectric layer thickness (250t) contacting the bottom electrode (240); an un-doped second piezoelectric layer (255, $I_1$) with a second piezoelectric layer thickness (255t) on top of the first piezoelectric layer (250); and a top electrode (290, $M_1$) with a top electrode thickness (290t). The first and the second piezoelectric layers (250, 255) form a first combined piezoelectric layer (255+250) with a first combined piezoelectric layer thickness (250Tt). The TFBAR (400a) thus forms a $M_1I_1D_1M_2$ or MIDM structure of RF resonator. It should be pointed out that TFBAR (400a) can be obtained by switching the first piezoelectric layer (250) and the second piezoelectric layer (255) in TFBAR (200b) shown in FIG. 2B. The TFBAR (400a) thus forms a $M_1I_1D_1M_2$ or a MIDM structure of RF resonator on a substrate.

The materials for the substrate (210) is selected from a material groups: Si, GaAs, glass, sapphire, AlN, $Al_2O_3$ as long as they have sufficiently high electrical resistivity, sufficient thermal conductivity and flat surfaces. The acoustic wave isolation region (215) could be a thin film reflector stack with a plurality of alternating high impedance layers and low impedance layers each with a quarter wavelength thickness: $\lambda/4$, $\lambda$ being the wavelength of acoustic waves in respective reflector layer, or an air cavity with an acoustic wave isolation region thickness (215t). The bottom support membrane thickness (230t) is preferably selected in a range of 50 nm to 500 nm and materials of the bottom support membrane (230) is selected from a group including: silicon oxide ($SiO_2$), silicon nitride ($Si_3N_4$), silicon oxynitrides and their combinations to effect temperature compensation and to reduce unwanted shift of resonant frequency $f_{o1}$ with the variation in the temperature during operation. According to another embodiment of this invention, a protective layer (not shown in FIG. 4A) can be adopted to further stabilize the resonant frequency of the TFBAR (400a).

The top electrode thickness (290t) and the bottom electrode thickness (240t) are selected to be in a range of 50 nm to 2 μm, dependent on the frequency of resonant required and the loading effect acceptable. Materials for the bottom electrode and the top electrode are selected from a material group: W, Pt, Mo, Al, Ta, Ti, Cu, Cr, Au, Ru, Ir and their combinations.

The first piezoelectric layer (250) is a semiconductor doped to a first piezoelectric semiconductor type which may be n-type or p-type and preferably to be n-type. The second piezoelectric layer (255) is not intentionally doped and it is intrinsic and electrically insulating. The first piezoelectric layer (250) has a first piezoelectric layer depletion region (250I) with a first piezoelectric layer depletion region thickness (250It) and a first piezoelectric layer neutral region (250N) with a first piezoelectric layer neutral region thickness (250Nt), defining a first piezoelectric depletion region edge (250B). The first piezoelectric layer depletion region (250I) is intrinsic and electrically insulating. The first piezoelectric layer depletion region (250I) and the electrically nonconductive second piezoelectric layer (255) form a first combined piezoelectric active layer (255+250I) having a first combined piezoelectric active layer thickness (250T't), to effect resonant of the TFBAR (400a) at a first frequency $f_{o1}$ and a plurality of other resonant frequencies when a first RF signal RF1 at the first frequency $f_{o1}$ is applied to the top electrode (290). The first DC voltage $V_{DC1}$ is applied between the top electrode (290) through a top electrode contact (290C) and bottom electrode (240) through a bottom electrode contact (240C) to bias the first combined piezoelectric layer (250+255). This will control the first piezoelectric layer depletion region thickness (250It) and the first piezoelectric layer neutral region thickness (250Nt), hence controls the combined piezoelectric active layer thickness (250T't) and leads to the control of resonant frequency of the TFBAR (200b), to facilitate transmission or blocking of a first RF1 signal being applied to the top electrode (290). The position of the first piezoelectric depletion region edge (250B) is controlled by a first DC voltage having a first voltage value $V_{DC1}$ applied between the bottom electrode (240) and the top electrode (290).

The doping level of the first piezoelectric layer (250) is preferably controlled to be in an impurity concentration range of $10^{14}$ cm$^{-3}$ to $10^{22}$ cm$^{-3}$ and is more preferably controlled to be in a range of $10^{16}$ to $10^{20}$ cm$^{-3}$ to control the sensitivity of the first DC voltage $V_{DC1}$ on controlling of the first piezoelectric layer depletion region thickness (250It) and hence the sensitivity of control of the resonant frequency.

The first piezoelectric layer thickness (250t) is selected to be in a range of 50 nm to 20 μm, dependent on the acoustic wave velocity in the first piezoelectric layer (250) and the first frequency $f_{o1}$ of resonant required for the application. The second piezoelectric layer thickness (255t) is also selected in a range of 50 nm to 20 μm dependent on the acoustic wave velocity in the second piezoelectric layer, the first frequency $f_{o1}$, and a plurality of other frequencies of resonant required for the applications. For given frequencies of operation, the first piezoelectric layer thickness (250t) should be selected so that when the maximum first DC voltage $V_{DC1}$ is applied to get the maximum first piezoelectric layer depletion region thickness (250It), the first piezoelectric layer neutral region thickness (250Nt) should be minimum, preferably close to zero so that unwanted loss of acoustic waves energy in the first piezoelectric layer neutral region (250N) is minimum.

Material of the first piezoelectric layer (250) is selected from a compound material group including: AlN, GaN, AlGaN, ZnO, GaAs, AlAs, AlGaAs as long as they are piezoelectric with sufficient acoustic-electric coupling coefficients and are semiconducting and can be doped to p-type and/or n-type conduction. Material of the second piezoelectric layer (255) is selected from a compound material group including: AlN, GaN, AlGaN, ZnO, GaAs, AlAs, AlGaAs, LiNbO$_3$, PZT, BaTiO$_3$, quartz and KNbO$_3$ as long as they are piezoelectric with sufficiently large acoustic-electric coupling coefficients and are compatible to the first piezoelectric layer (250).

When a substantially positive first DC voltage having a first DC voltage value $V_{DC1}$ is applied between the top electrode (290)) and bottom electrode (240) to bias the first combined piezoelectric layer (250+255), the first piezoelectric layer depletion region thickness (250It) increases and the first piezoelectric layer neutral region thickness (250Nt) decreases. This will create a first combined piezoelectric active layer (250I+255) with a first combined piezoelectric active layer thickness (250Tt) and produce a resonance at a first frequency $f_{o1}$ so that when a first RF1 signal at a first frequency at $f_{o1}$ with a first bandwidth BW1 being applied to the top electrode transmission of the RF1 signal will be allowed and any RF signals or microwaves at frequencies other than $f_{o1}$ will be blocked.

Voltage value of the first DC voltage $V_{DC1}$ maybe increased or decreased to produce a new resonant frequency $f_{o1}$ which could be the transmit frequency or receive frequency in the same band or transmit frequency or receive frequency in other band. It is thus clear that a plurality of first DC voltage values: $V_{DC1\text{-}1}$, $V_{DC1\text{-}2}$, - - - $V_{DC1\text{-}N}$, may be applied one at a time to produce a plurality of resonant frequencies: $f_{o1\text{-}1}$, $f_{o1\text{-}2}$, - - - $f_{o1\text{-}N}$ for transmit frequency or receive frequency of a band or other bands. As the formation of the first piezoelectric layer depletion region is due to evacuation of major carriers, the switching from one resonant frequency to the other frequency is very fast and only limited by the RC time constant of the TFBAR. The tunable MIDM TFBAR may be used in a tunable filter and an oscillator for microwave applications.

Therefore, according to this invention, the resonant properties of the MIDM (400*a*) is tunable by varying the first DC biasing voltage $V_{DC1}$. When the first DC biasing voltage is varied, both the first piezoelectric layer depletion region thickness (250It) and the first piezoelectric layer neutral region thickness (250Nt) will change. The change in the first piezoelectric layer depletion region thickness (250It) changes the first combined piezoelectric active layer thickness (255*t*+250It) or (250T't) and produce a first change component in the resonant frequency. On the other hand, the change in the first piezoelectric layer neutral region thickness (250Nt) changes the loading effect and the velocity effect and produces a second change component in the resonant frequency. Hence, the resonant frequency and properties of the MIDM TFBAR (400*a*) is tunable with the variation of the first DC biasing voltage $V_{DC1}$.

When a plurality of TFBARs (400*a*) are connected into a ladder filter or a lattice filter, a narrow band pass characteristic is achieved to allow the transmission of a first RF1 signal at a first RF1 frequency $f_{o1}$, which could be a receive frequency for a given communication band, whereas RF signals at frequencies other than fo1 and first bandwidth BW1 are not allowed to pass through.

Tunable $M_1D_2I_1D_1M_2$ or MDIDM Resonators and Filters:

According to yet another embodiment of this invention, a tunable $M_1D_2I_1D_1M_2$ or MDIDM film bulk acoustic resonator for forming a tunable microwave acoustic filters for microwave communication units is provided. In addition to the microwave acoustic filters, such MDIDM TFBARs are also suited for microwave acoustic switches and other microwave devices.

Figure 4B:
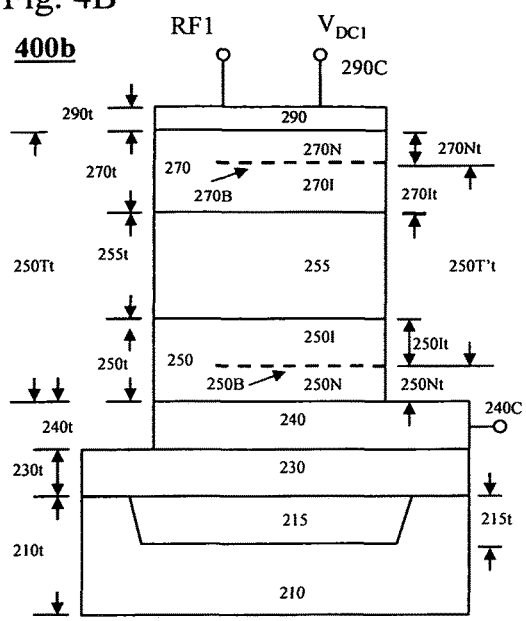
FIG. 4B is a schematic cross-sectional diagram showing a TFBAR (400b) with an MDIDM structure, to effect resonant at a first frequency $f_{o1}$ which is tunable by the DC biasing voltage $V_{DC1}$, according to this invention.

FIG. 4B shows a schematic cross-sectional diagram of a tunable film bulk acoustic resonator TFBAR (400*b*), in an MDIDM form according to yet another embodiment of this invention. The TFBAR (400*b*) comprises a substrate (210) with a substrate thickness (210*t*); an acoustic wave isolation region (215) with an acoustic wave isolation region thickness (215*t*); a bottom support membrane (230) with a bottom support membrane thickness (230*t*); a bottom electrode (240, $M_2$) with a bottom electrode thickness (240*t*); a first piezoelectric layer (250; $D_1$) with a first piezoelectric layer thickness (250*t*); an un-doped second piezoelectric layer (255, $I_1$) with a second piezoelectric layer thickness (255*t*); a doped third piezoelectric layer (270, $D_2$) with a third piezoelectric layer thickness (270*t*); a top electrode (290, $M_1$) with a top electrode thickness (290*t*). The first, second and third piezoelectric layers (250, 255, 270) form a first combined piezoelectric layer (250+255+270) with a first combined piezoelectric layer thickness (250Tt). The TFBAR (400*b*) thus forms a $M_1D_2I_1D_1M_2$ or MDIDM structure of RF resonator on a substrate.

The materials for the substrate (210) is selected from a group including: Si, GaAs, glass, sapphire, AlN, $Al_2O_3$ as long as they have sufficiently high electrical resistivity, sufficient thermal conductivity and flat surfaces. The acoustic wave isolation region (215) which could be a thin film reflector stack with a plurality of alternating high impedance layers and low impedance layers each with a quarter wavelength thickness: $\lambda/4$, $\lambda$ being the wavelength of acoustic waves in respective reflector layer, or an air cavity which has an acoustic wave isolation region thickness (215*t*).

The bottom support membrane thickness (230*t*) is preferably selected in a range of 50 nm to 500 nm and materials of the bottom support membrane (230) is selected from a group including: silicon oxide ($SiO_2$), silicon nitride ($Si_3N_4$), silicon oxynitrides and their combinations to effect temperature compensation and to reduce unwanted shift of resonant frequency $f_{o1}$ with the variation in the temperature during operation. According to another embodiment of this invention, a protective layer (not shown in FIG. 4B) can be adopted to further stabilize the resonant frequency of the TFBAR (400*b*). The top electrode thickness (290*t*) and the bottom electrode thickness (240*t*) are selected to be in a range of 50 nm to 2 µm, dependent on the frequency of resonant required and the loading effect acceptable. Materials for the bottom electrode and the top electrode are selected from a material group: W, Pt, Mo, Al, Ta, Ti, Cu, Cr, Au, Ru, Ir and their combinations.

The first piezoelectric layer (250) is a semiconductor doped to a first piezoelectric semiconductor type which may be n-type or p-type and preferably to be n-type. The second piezoelectric layer (255) is not intentionally doped and it is electrically non-conductive. The third piezoelectric layer (270) is a doped semiconductor and is partly conductive with a third piezoelectric layer conducting type which is opposite to the first piezoelectric layer conducting type.

The first piezoelectric layer (250) has a first piezoelectric layer depletion region (250I) with a first piezoelectric layer depletion region thickness (250It) and a first piezoelectric layer neutral region (250N) with a first piezoelectric layer neutral region thickness (250Nt), defining a first piezoelectric depletion region edge (250B). The third piezoelectric layer (270) has a third piezoelectric layer depletion region (270I) with a third piezoelectric layer depletion region thickness (20It) and a third piezoelectric layer neutral region (270N) with a third piezoelectric layer neutral region thickness (270Nt), defining a third piezoelectric depletion region edge (270B). The first piezoelectric layer depletion region (250I) and the third piezoelectric layer depletion region (270I) are intrinsic and electrically insulating. The positions of the first piezoelectric depletion region edge (250B) and the third piezoelectric depletion region edge (270B) are controlled by a first DC voltage of value $V_{DC1}$ applied between the bottom electrode (240) and the top electrode (290).

When a first DC voltage having a first voltage value $V_{DC1}$ is applied between the top electrode (290) through a top electrode contact (290C) and the bottom electrode (240) through a bottom electrode contact (240C) to bias the first combined piezoelectric layer (250+255+270) with a first combined piezoelectric layer thickness (250Tt), a first piezoelectric layer depletion region (250I) with a first piezoelectric layer depletion region thickness (250It), a first piezoelectric layer neutral region (250N) with a first piezoelectric neutral region thickness (250Nt), a third piezoelectric layer depletion region (270I) with a third piezoelectric layer depletion region thickness (270It) and a third piezoelectric layer neutral region (270N) with a third piezoelectric neutral region thickness (270Nt) are formed. This produces a first combined piezoelectric active layer (250I+255+270I) with a first combined piezoelectric active layer thickness (250T't) to achieve a resonance at a first frequency $f_{o1}$ and to facilitate transmission or blocking of a first RF signal RF1 signal applied to the top electrode (290).

The doping level of the first piezoelectric layer (250) is preferably controlled to be in an impurity concentration range of $10^{14}$ cm$^{-3}$ to $10^{22}$ cm$^{-3}$ and is more preferably controlled to be in a range of $10^{16}$ to $10^{20}$ cm$^{-3}$ to control the sensitivity of the first DC voltage $V_{DC1}$ on controlling of the first piezoelectric layer depletion region thickness (250It) and hence the sensitivity of control of the resonant frequency.

The third piezoelectric layer (270) is doped to an impurity concentration in a range from $10^{14}$ cm$^{-3}$ to $10^{22}$ cm$^{-3}$ and more preferably from $10^{16}$ to $10^{20}$ cm$^{-3}$ to control the sensitivity of the first DC voltage on control of the third piezoelectric layer depletion region thickness (270It) and hence the sensitivity of control of said resonant frequency, forming a first combined piezoelectric layer (250+255+270) having a first combined piezoelectric layer thickness (250Tt), The first and third piezoelectric layer thickness (250t, 270t) is selected to be in a range of 50 nm to 20 μm, dependent on the acoustic wave velocity in said first piezoelectric layer and the first frequency $f_{o1}$ of resonant and a plurality of other resonant frequencies for the applications. For given frequencies of operation, the first piezoelectric layer thickness (250t) and the third piezoelectric layer thickness (270t) should be selected so that when the maximum first DC voltage $V_{DC1}$ is applied to get a maximum value for the first piezoelectric layer depletion region thickness (250It) and the third piezoelectric layer depletion region thickness (270It), the first piezoelectric layer neutral region thickness (250Nt) and the third piezoelectric layer neutral region thickness 270Nt) should be minimum, preferably close to zero so that unwanted loss of acoustic waves energy in the first and the third piezoelectric layer neutral regions is minimum. Materials of the first piezoelectric layer (250) and the third piezoelectric layer (270) are selected from a group including: AlN, GaN, AlGaN, ZnO, GaAs, AlAs, AlGaAs as long as they are piezoelectric with sufficient acoustic coupling coefficients and are semiconducting and can be doped to p-type or n-type conduction.

The second piezoelectric layer thickness (255t) is selected in a range of 50 nm to 20 μm, dependent on the acoustic wave velocity in said second piezoelectric layer and the first frequency $f_{o1}$ of resonant for the applications. Material of the second piezoelectric layer (255) is selected from a compound material group including: AlN, GaN, AlGaN, ZnO, GaAs, AlAs, AlGaAs, LiNbO$_3$, PZT, BaTiO$_3$, quartz and KNbO$_3$, as long as they are piezoelectric with sufficiently large acoustic-electric coupling coefficients and are compatible to the first and the third piezoelectric layers.

Voltage value of the first DC voltage $V_{DC1}$ maybe increased or decreased to produce a new resonant frequency $f'_{o1}$ which could be the transmit frequency or receive frequency in the same band or transmit frequency or receive frequency in other band. Therefore, according to this invention, the resonant properties of the MDIDM is tunable by varying the DC biasing voltage. When the first DC voltage is varied, the first piezoelectric layer depletion region thickness (250It), the third piezoelectric layer depletion region thickness (270It), the first piezoelectric layer neutral region thickness (250Nt) and the third piezoelectric layer neutron region thickness (270Nt) will all change. The change in the first piezoelectric layer depletion region thickness (250It) and the third piezoelectric layer depletion region thickness (270It) will change the first combined piezoelectric active layer thickness (270It+255t+250It) or (250T't) in the MDIDM TFBAR (400b) and produce a first change component in the resonant frequency. At the same time, a change in the first piezoelectric layer neutral region thickness (250Nt) and the third piezoelectric layer neutral region thickness (270Nt) will change the loading effect and the velocity effect. Hence, the resonant frequency and properties of the MDIDM TFBAR (400b) is tunable with the variation of the DC biasing voltage.

Therefore, a plurality of first DC voltage values: $V_{DC1-1}$, $V_{DC1-2}$, - - - $V_{DC1-N}$, may be applied to TFBAR (400b) one at a time to produce a plurality of resonant frequencies: $f_{o1-1}$, $f_{o1-2}$, - - - $f_{o1-N}$ for transmit frequency or receive frequency of a band or other bands. As the formation of the first and the third piezoelectric layer depletion regions is due to evacuation of major carriers, the switching from one resonant frequency to the other frequency is very fast and only limited by the RC time constant of the TFBAR. The tunable MDIDM TFBAR may be used in a tunable filter and an oscillator for microwave applications.

When a plurality of the TFBAR (400b) are connected into a ladder filter or a lattice filter together with other passive components such as capacitors and inductors, a narrow band pass characteristic is obtained to allow the transmission of a RF energy of the first RF1 signal at a first frequency $f_{o1}$ with a first bandwidth BW1, which could be a receive frequency or a receive frequency for a given communication band. RF signals at frequencies other than $f_{o1}$ and outside BW1 are not allowed to pass through.

Tunable $M_1D_1D_2M_2$ or MDDM Resonators and Microwave Filters:

According to yet another embodiment of this invention, a tunable MDDM film bulk acoustic resonator for forming a tunable microwave acoustic filters for microwave communication units is provided. In addition to the microwave acoustic filters, such MDDM TFBARs are also suitable for microwave acoustic switches and other microwave devices.

Figure 4C:
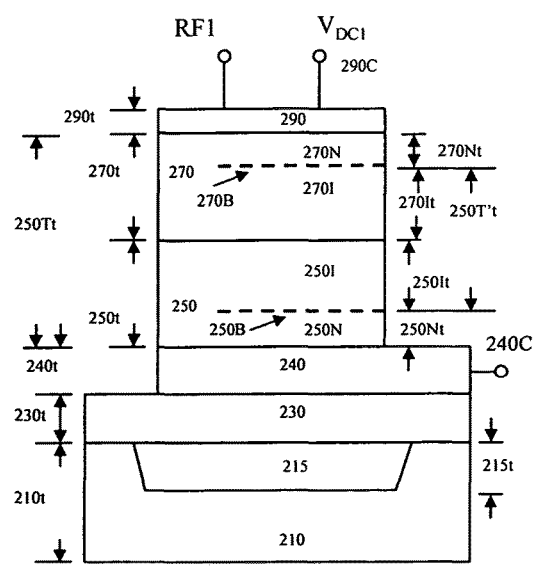
FIG. 4C is a schematic cross-sectional diagram showing a TFBAR (400c) with an MDDM structure, to effect resonant at a first frequency $f_{o1}$ which is tunable by the DC biasing voltage $V_{DC1}$, according to this invention.

FIG. 4C shows a schematic cross-sectional diagram of a tunable film bulk acoustic resonator TFBAR (400c) in an MDDM form according to this invention. TFBAR (400c) comprises a substrate (210) with a substrate thickness (210t); an acoustic wave isolation region (215) with an acoustic wave isolation region thickness (215t); a bottom support membrane (230) with a bottom support membrane thickness (230t); a bottom electrode (240, M2) with a bottom electrode thickness (240t); a doped first piezoelectric layer (250, D1) with a first piezoelectric layer thickness; a doped third piezoelectric layer (270, D2) with a third piezoelectric layer thickness (270t); and a top electrode (290) with a top electrode thickness (290t). The first and the third piezoelectric layers (250, 270) form a first combined piezoelectric layer (250+270) with a first combined piezoelectric layer thickness (250Tt). The FBAR (400c) thus forms a $M_1D_1D_2M_2$ or a MDDM structure of RF resonator on a substrate.

The materials for the substrate is selected from a material groups: Si, GaAs, glass, sapphire, AlN, Al$_2$O$_3$ as long as they have sufficiently high electrical resistivity, sufficient thermal conductivity and flat surfaces. The acoustic wave isolation region (215) could be a thin film reflector stack with a plurality of alternating high impedance layers and low impedance layers each with a quarter wavelength thickness: $\lambda/4$, $\lambda$ being the wavelength of acoustic waves in respective reflector layer, or an air cavity with an acoustic wave isolation region thickness (215t).

The bottom support membrane thickness (230t) is preferably selected in a range of 50 nm to 500 nm and material of the bottom support membrane (230) is selected from a group including: silicon oxide (SiO$_2$), silicon nitride (Si$_3$N$_4$), silicon oxynitrides and their combinations to effect temperature compensation and to reduce unwanted shift of resonant frequency $f_{o1}$ with the temperature variation during operation. According to another embodiment of this invention, a protective layer (not shown in FIG. 2B) can be adopted to further stabilize the resonant frequency of the TFBAR (200b). The top electrode thickness (290t) and the bottom electrode thickness (240t) are selected to be in a range of 50 nm to 2 μm, dependent on the frequency of resonant required and the loading effect acceptable. Materials for the bottom electrode and the top electrode are selected from a material group: W, Pt, Mo, Al, Ta, Ti, Cu, Cr, Au, Ru, Ir and their combinations.

The first piezoelectric layer (250) is a doped and partly electrically conductive semiconductor having a first piezoelectric layer conducting type which may be n-type or p-type. The third piezoelectric layer (270) is a doped and partly electrically conductive semiconductor having a third piezoelectric semiconductor type which may be p-type or n-type and is opposite to the first piezoelectric layer conducting type.

When a first DC voltage having a first DC voltage value $V_{DC1}$ is applied to between the top electrode (290) through a top electrode contact (290C) and the bottom electrode (240) through a bottom electrode contact (240C) to bias the first combined piezoelectric layer (250+270), a first piezoelectric layer depletion region (250I) with a first piezoelectric layer depletion region thickness (250It), a first piezoelectric layer neutral region (250N) with a first piezoelectric layer neutral region thickness (250Nt), an third piezoelectric layer depletion region (270I) with a third piezoelectric layer depletion region thickness (270It), and a third piezoelectric layer neutral region (270N) with a third piezoelectric layer neutral region thickness (270Nt) are formed. This produces a first combined piezoelectric active layer (250I+270I) with a first combined piezoelectric active layer thickness (250T't) to effect resonant at a first central frequency $f_{o1}$, and to facilitate transmission or blocking of a first RF1 signal applied to the top electrode (290).

According to this invention, the resonant properties of the MDDM TFBAR is tunable by varying the first DC biasing voltage $V_{DC1}$. When the DC biasing voltage is varied, the first piezoelectric layer depletion region thickness (250It), the third piezoelectric layer depletion region thickness (270It), the first piezoelectric layer neutral region thickness (250Nt) and third piezoelectric layer neutron region thickness (270Nt) will change. The changes in the first piezoelectric layer depletion region thickness (250It) and in the third piezoelectric layer depletion region thickness (270It) will change the MDIDM TFBAR first combined piezoelectric active layer (250T't) and effect a first change component in resonant frequency. Whereas changes in the first piezoelectric layer neutral region thickness (250Nt) and the third piezoelectric layer neutral region thickness (270Nt) will change the loading effect and the velocity effect and produce a second change component in the resonant frequency. Hence, the resonant properties of the MDDM TFBAR (400c) changes with the variation of the DC biasing voltage $V_{DC1}$ to effect a change in resonant frequency and properties. Therefore the DC biasing voltage $V_{DC1}$ are thus used in this invention to control resonant frequency of the MDDM TFBAR (400c) in this invention.

When a plurality of the film bulk acoustic resonators (400c) are connected into a ladder filter or a lattice filter, a narrow band pass characteristic is formed to allow the transmission of a portion of the first RF1 signal at a first RF1 frequency $f_{o1}$ and first band width BW1, which could be a receive frequency or transmit frequency for a given communication band, whereas RF signals at frequencies other than $f_{o1}$ and outside the first bandwidth BW1 are not allowed to pass through.

The doping levels of the first and the third piezoelectric layer (250, 270) are preferably controlled to an impurity concentration range of $10^{14}$ cm$^{-3}$ to $10^{22}$ cm$^{-3}$ and is more preferably controlled to a range of $10^{16}$ to $10^{20}$ cm$^{-3}$ to control the sensitivity of the first DC voltage $V_{DC1}$ on controlling of the first piezoelectric layer depletion region thickness (250It) and the third piezoelectric layer depletion region thickness (270It) hence the sensitivity of control of the resonant frequency.

The thicknesses of the first and the third piezoelectric layer (250t, 270t) are selected to be in a range of 50 nm to 10 μm dependent on the acoustic wave velocity in the first and the third piezoelectric layers and in the third piezoelectric layer and the first frequency $f_{o1}$ of resonant and a plurality of other resonant frequencies for the applications. For given frequencies of operation, the first piezoelectric layer thickness (250t) and the third piezoelectric layer thickness (270t) should be selected so that when first DC voltage $V_{DC1}$ of a maximum value is applied to get the maximum first piezoelectric layer depletion region thickness (250It) and the maximum third piezoelectric layer depletion region thickness (270It), the first piezoelectric layer neutral region thickness (250Nt) and the third piezoelectric layer neutral region thickness (270Nt) should be a minimum, preferably close to zero so that unwanted loss of acoustic waves energy in the first piezoelectric layer neutral region is minimum.

Materials of the first and the third piezoelectric layers (250, 270) are selected from a group including: AlN, GaN, AlGaN, ZnO, GaAs, AlAs, AlGaAs as long as they are piezoelectric with sufficient acoustic coupling coefficients, are semiconducting and can be doped to n-type or p-type conduction.

Variation of the first DC voltage value $V_{DC1}$ causes an increase or a decrease in the first combined piezoelectric active layer thickness (250T't), and produces a decrease or an increase in the first central frequency of resonance and hence a new resonant frequency $f'_{o1}$, which could be the transmit frequency or receive frequency in same band or transmit frequency or receive frequency in the other band. Therefore, a plurality of first DC voltage values: $V_{DC1-1}$, $V_{DC1-2}$, - - - $V_{DC1-N}$, may be applied one at a time to produce a plurality of resonant frequencies: $f_{o1-1}$, $f_{o1-2}$, - - - $f_{o1-N}$ for transmit frequency or receive frequency of a band or other bands. As the formation of the first piezoelectric layer depletion region is due to evacuation of major carriers, the switching from one resonant frequency to the other frequency is fast and only limited by the RC time constant of the TFBAR. The tunable MDDM TFBAR may be used in a tunable filter and an oscillator for microwave applications.

Tunable MDIDIDM Resonators and Microwave Filters:

According to yet another embodiment of this invention, a tunable MDIDIDM film bulk acoustic resonator for forming a tunable microwave acoustic filters for microwave communication units. In addition to the microwave acoustic filters, such MDIDIDM TFBARs are also suited for microwave acoustic switches and other microwave devices.

Figure 4D:
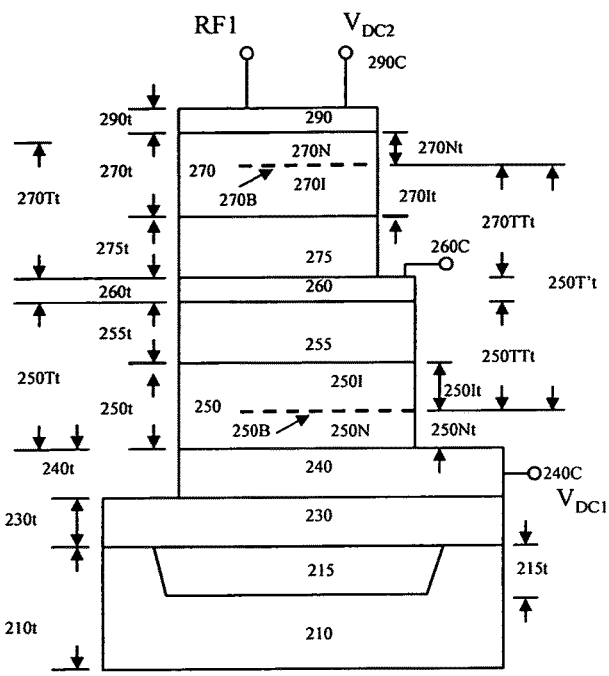
FIG. 4D is a schematic cross-sectional diagram showing a TFBAR (400d) with an MDIDIDM structure, to effect resonant at a first frequency $f_{o1}$ which is tunable by the DC biasing voltage $V_{DC1}$, according to this invention.

FIG. 4D shows a schematic cross-sectional diagram of a tunable film bulk acoustic resonator TFBAR (400d) according to yet another embodiment of this invention. The TFBAR (400c) comprises a substrate (210) with a substrate thickness (210t); acoustic wave isolation region (215) with an acoustic wave isolation region thickness (215t); a bottom support membrane (230) with a bottom support membrane thickness (230t); a bottom electrode (240, M$_2$) with a bottom electrode thickness (240t); a doped first piezoelectric layer (250; D$_1$) with a first piezoelectric layer thickness (250t); an un-doped second piezoelectric layer (255, I$_1$) with a second piezoelectric layer thickness (255t); a doped fourth piezoelectric layer (260, D$_2$) with a fourth piezoelectric layer thickness (260t) is electrically connected to a fourth piezoelectric layer contact (260C); an un-doped fifth piezoelectric layer (275, I$_2$) with a fifth piezoelectric layer thickness (275$t$); a doped third piezoelectric layer (270, D$_3$) with a third piezoelectric layer thickness (270$t$); a top electrode (290, M$_1$) with a top electrode thickness (290$t$). The first, second, fourth, fifth and third piezoelectric layers (250, 255, 260, 275, 270) form a first combined piezoelectric layer (250+255+260+275+270) with a first combined piezoelectric layer thickness (250$t$+255$t$+260$t$+275$t$+270$t$). The TFBAR (400$d$) thus forms a M$_1$D$_2$I$_2$D$_3$I$_1$D$_1$M$_2$ or a MDI-DIDM structure of RF resonator on a substrate.

The materials for the substrate (210) is selected from a group including: Si, GaAs, glass, sapphire, AlN, Al$_2$O$_3$ as long as they have sufficiently high electrical resistivity, sufficient thermal conductivity and flat surfaces. The acoustic wave isolation region (215) which could be a thin film reflector stack with a plurality of alternating high impedance layers and low impedance layers each with a quarter wavelength thickness: λ/4, λ being the wavelength of acoustic waves in respective reflector layer, or an air cavity which has an acoustic wave isolation region thickness (215$t$).

The bottom support membrane thickness (230$t$) is preferably selected in a range of 50 nm to 500 nm and materials of the bottom support membrane (230) is selected from a group including: silicon oxide (SiO$_2$), silicon nitride (Si$_3$N$_4$), silicon oxynitrides and their combinations to effect temperature compensation and to reduce unwanted shift of resonant frequency f$_{o1}$ with the variation in the temperature during operation. According to another embodiment of this invention, a protective layer (not shown in FIG. 4B) can be adopted to further stabilize the resonant frequency of the TFBAR (400$b$). The top electrode thickness (290$t$) and the bottom electrode thickness (240$t$) are selected to be in a range of 50 nm to 2 μm, dependent on the frequency of resonant required and the loading effect acceptable. Materials for the bottom electrode and the top electrode are selected from a material group: W, Pt, Mo, Al, Ta, Ti, Cu, Cr, Au, Ru, Ir and their combinations.

The first piezoelectric layer (250) is a doped and partly electrically conducting semiconductor with a first semiconductor type which may be either n-type or p-type. The second piezoelectric layer (255) is not intentionally doped and it is electrically non-conductive. The first piezoelectric layer (250) and the second piezoelectric layer (255) forms a first part of the first combined piezoelectric layer (250+255) having a thickness (250Tt). The fourth piezoelectric layer (260) is a heavily doped and conducting semiconductor, connected electrically to a fourth piezoelectric layer contact (260C). The fifth piezoelectric layer (275) is un-doped and electrically non-conductive. The third piezoelectric layer (270) is a doped and partly electrically conducting semiconductor having a third piezoelectric semiconducting type opposite to the first piezoelectric semiconducting type. The fifth piezoelectric layer (275) and the third piezoelectric layer (270) forms a second part of the first combined piezoelectric layer (275+270) having a thickness (270Tt).

When a first DC voltage having a substantially positive first voltage value V$_{DC1}$ is applied between the bottom electrode (240) through a bottom electrode contact (240C) and the fourth piezoelectric layer (260) through the fourth piezoelectric layer contact (260C) to bias the first part of the first combined piezoelectric layer (250+255) to produce a first piezoelectric layer depletion region (250I) with a first piezoelectric layer depletion region thickness (250It), a first piezoelectric layer neutral region (250N) with a first piezoelectric layer neutral region thickness (250Nt), defining a first piezoelectric depletion region edge (250B) and forming a first part of a first combined piezoelectric active layer (250I+255) with a thickness (250It+255$t$) or (250TTt). When a second DC voltage having a substantially positive second voltage value V is applied between the top electrode (290) through a top electrode contact (290C) and the fourth piezoelectric layer (260) through the fourth piezoelectric layer contact (260C) to bias the second part of the first combined piezoelectric layer (275+270) to produce a third piezoelectric layer depletion region (270I) with a third piezoelectric layer depletion region thickness (270It), a third piezoelectric layer neutral region (270N) with a third piezoelectric layer neutral region thickness (270Nt), defining a third piezoelectric depletion region edge (270B) and forming a second part of the first combined piezoelectric active layer (275+270I) with a thickness (275+270It) or (270TTt).

The first part of the first combined piezoelectric active layer (250I+255), the second part of the first combined piezoelectric active layer (270I+275) and the fourth piezoelectric layer (260) thus form an overall first combined piezoelectric active layer (250I+255+260+275+270I) to effect resonant at a first central frequency f$_{o1}$. Variations of the first DC voltage value V$_{DC1}$ and the variation of the second DC voltage value V$_{DC2}$ cause an increase or decrease in the overall first combined piezoelectric active layer thickness (250It+255$t$+260$t$+275$t$+270It) or (250TTt+260$t$+270TTt) or (250Tt), and a decrease or increase in the first central frequency f$_{o1}$ of resonance to facilitate transmission or blocking of a first RF1 signal applied to the top electrode (290).

The doping level of the first piezoelectric layer (250) is preferably controlled to be in an impurity concentration range of $10^{14}$ cm$^{-3}$ to $10^{22}$ cm$^{-3}$ and is more preferably controlled to be in a range of $10^{16}$ to $10^{20}$ cm$^{-3}$ to control the sensitivity of the first DC voltage V$_{DC1}$ on controlling of the first piezoelectric layer depletion region thickness (250It) and hence the sensitivity of control of the resonant frequency. The third piezoelectric layer (270) is doped to an impurity concentration in a range from $10^{14}$ cm$^{-3}$ to $10^{22}$ cm$^{-3}$ and more preferably from $10^{16}$ to $10^{20}$ cm$^{-3}$ to control the sensitivity of the first DC voltage on control of the third piezoelectric layer depletion region thickness (270It) and hence the sensitivity of control of the resonant frequency.

Materials of the first piezoelectric layer, the third piezoelectric layer and the fourth piezoelectric layer are selected from a group including: AlN, GaN, AlGaN, ZnO, GaAs, AlAs, AlGaAs as long as they are piezoelectric with sufficient acoustic coupling coefficients and are semiconducting and can be doped to n-type or p-type conduction. Whereas materials of the second piezoelectric layer and fifth piezoelectric layer are selected from a group including: AlN, GaN, AlGaN, ZnO, GaAs, AlAs, AlGaAs, LiNbO$_3$, PZT, BaTiO$_3$, quartz and KNbO$_3$, as long as they are piezoelectric with sufficiently large acoustic-electric coupling coefficients.

The first and the third piezoelectric layer thickness (250$t$, 270$t$) is selected to be in a range of 50 nm to 10 μm dependent on the acoustic wave velocity in the first and the third piezoelectric layers and the first frequency f$_{o1}$ of resonant for the application. The second and the fifth piezoelectric layer thickness (255$t$, 275$t$) is selected to be in a range of 50 nm to 10 μm dependent on the acoustic wave velocity in the second and the fifth piezoelectric layers and the first frequency f$_{o1}$ of resonant and a plurality of other resonant frequencies for the applications. The fourth piezoelectric layer thickness (260$t$) is selected from a range of 50 nm to 1 μm. For given frequencies of operation, the first piezoelectric layer thickness (250$t$) should be selected so that when the maximum first DC voltage V$_{DC1}$ is applied to get the maximum first piezoelectric layer depletion region thickness (250It), the first piezoelectric layer neutral region thickness (250Nt) should be minimum, preferably close to zero so that unwanted loss of acoustic waves energy in the first piezoelectric layer neutral region is minimum. Similarly, the third piezoelectric layer thickness (270t) should be selected so that when the maximum second DC voltage $V_{DC2}$ is applied to get the maximum third piezoelectric layer depletion region thickness (270It), the third piezoelectric layer neutral region thickness (270Nt) should be minimum, preferably close to zero so that unwanted loss of acoustic waves energy in the third piezoelectric layer neutral region is minimum.

Voltage values of the first DC biasing voltage and second DC biasing voltage maybe increased or decreased to produce a new resonant frequency $f_{o1}$ which could be the transmit frequency or receive frequency in same band or transmit frequency or receive frequency in the other band. Therefore, according to this invention, the resonant properties of the MDIDIDM TFBAR is tunable or adjustable by varying the DC biasing voltages. When the DC biasing voltages $V_{DC1}$, $V_{DC2}$ are varied, the first piezoelectric layer depletion region thickness (250It), the third piezoelectric layer depletion region thickness (270It), the first piezoelectric layer neutral region thickness (250Nt) and the third piezoelectric layer neutron region thickness (270Nt) will change. The change in the first piezoelectric layer depletion region thickness (250It) and the third piezoelectric layer depletion region thickness (270It) will change the MDIDM FBAR overall first combined piezoelectric active layer thickness (270It+255t+260I+275t+250It) or (250T't) and produce a first change component of resonant frequency. On the other hand, a change in the first piezoelectric layer neutral region thickness (250Nt) and the third piezoelectric layer neutral region thickness (270Nt) will change the loading effect and the velocity effect and causes a second change component in the resonant frequency. Hence, the resonant properties of the MDIDIDM TFBAR changes with the variation of the DC biasing voltages to effect a change in resonant frequency and properties. The change in the first piezoelectric layer depletion region thickness and third piezoelectric layer depletion region thickness and the associated change in the first piezoelectric layer neutral region thickness and the associated change in the third piezoelectric layer neutral region thickness by varying the DC biasing voltages $V_{DC1}$ and $V_{DC2}$ are thus used in this invention to control resonant frequency of the MDIDID M TFBAR in this invention.

Therefore, a plurality of first DC voltage values: $V_{DC1-1}$, $V_{DC1-2}$, - - - $V_{DC1-N}$, and a plurality of second DC voltage values: $V_{DC2-1}$, $V_{DC2-2}$, - - - $V_{DC2-N}$, may be applied one at a time to produce a plurality of resonant frequencies: $f_{o1-1}$, $f_{o1-2}$, - - - $f_{o1-N}$ for transmit frequency or receive frequency of a band or other bands. As the formation of the first piezoelectric layer depletion region and the third piezoelectric layer depletion region is due to evacuation of major carriers, the switching from one resonant frequency to the other frequency is fast and limited by the RC time constant of the TFBAR. The tunable MDIDIDM TFBAR may be used in a tunable filter and an oscillator for microwave applications.

When a plurality of the TFBARs (400d) are connected into a ladder filter or a lattice filter, a narrow band pass characteristic is achieved to allow the transmission of a portion of first RF1 signal at a first RF1 central frequency $f_{o1}$ and a first bandwidth BW1, which is a receive frequency or transmit frequency for a given communication band. RF signals at frequencies other than $f_{o1}$ and outside the first bandwidth BW1 are not allowed to pass through.

Figure 4E:
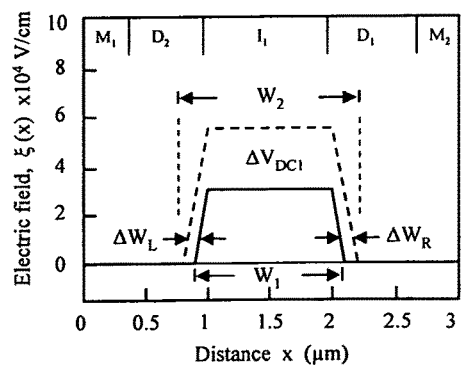
FIG. 4E shows variation of electric field $\xi(x)$ with distance x throughout a TFBAR of MDIDM structure where the doping levels in the first and third piezoelectric layers (D1 and D3) are high. When a DC voltage of value $V_{DC1a}$ is applied the electric field distribution is given by the solid curve. When a DC voltage of value $V_{DC1b}$ is applied the electric field distribution is given the dotted curve, where a total increase in the first combined piezoelectric active layer thickness is $\Delta W = \Delta W_L + \Delta W_R$.

FIG. 4E shows variation of electric field $\xi(x)$ with distance x throughout a TFBAR of $M_1D_2I_1D_1M_2$ structure (400b, shown in FIG. 4B) having a first combined piezoelectric layer ($D_2+I_1+D_1$) with high doping concentrations in the first piezoelectric layer ($D_1$) and the third piezoelectric layer (D2) and no doping in the second intrinsic piezoelectric layer ($I_1$). When a first biasing voltage value for the first DC voltage $V_{DC1a}$ is applied, the electric field distribution is given by the solid curve. When a second biasing value for the first DC voltage $V_{DC1b}$ is applied, the electric field distribution is given by the dotted curve. Here, $|V_{DC1b}|>|V_{DC1a}|$ and $\Delta V_{DC1}=|V_{DC1b}|-|V_{DC1a}|$. It is noted that the first piezoelectric layer ($D_1$) depletion region thickness increases by $\Delta W_L$ and the third piezoelectric layer ($D_2$) depletion region thickness increases by $\Delta W_R$ so that the increase of the first combined piezoelectric active layer thickness is $W_2-W_1=\Delta W_L+\Delta W_R=\Delta W$. This change in the depletion region thickness $\Delta W$ is due to the change in the first DC voltage $\Delta V_{DC1}$ and the tuning sensitivity can be represented by $\Delta W/\Delta V_{DC1}$ for this TFBAR.

Figure 4F:
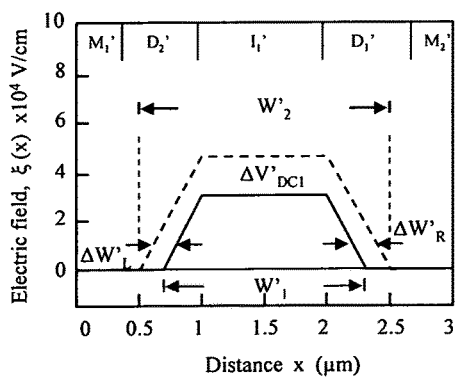
FIG. 4F shows variation of electric field $\xi(x)$ with distance x throughout a TFBAR of MDIDM structure where the doping levels in the first and the third piezoelectric layers ($D_1'$ and $D_2'$) are low. When a DC voltage of value $V'_{DC1a}$ is applied the electric field distribution is given by the solid curve. When a DC voltage of value $V'_{DC1b}$ is applied the electric field distribution is given Dotted curve, where a total increase in the first combined piezoelectric active layer thickness is $\Delta W' = \Delta W'_L + \Delta W'_R$.

It should be noted that the tuning sensitivity $\Delta W/\Delta V_{DC1}$ can be affected by the doping concentration in the doped first and the third piezoelectric layers. FIG. 4F shows the variation of electric field $\xi(x)$ with distance x throughout a TFBAR of MDIDM structure having a first combined piezoelectric layer ($D_1+I_1+D_2$) with low doping concentrations in the first semiconducting piezoelectric layer ($D_1$) and the third semiconducting piezoelectric layer ($D_2$) and no doping in the second piezoelectric layer ($I_1$). When a first biasing voltage value for the first DC voltage $V'_{DC1a}$ is applied, the electric field distribution is given by the solid curve. When a second biasing value for the first DC voltage $V'_{DC1b}$ is applied the electric field distribution is given the dotted curve. Here $|V'_{DC1b}|>|V'_{DC1a}|$, and $\Delta V_{DC1}=|V_{DC1b}|-|V_{DC1a}|$. It is seen that the first piezoelectric layer ($D_1$) depletion region thickness increases by $\Delta W'_L$ and the third piezoelectric layer ($D_2$) depletion region thickness increases by $\Delta W'_R$ so that the increase of the first combined piezoelectric active layer thickness is $W'_2-W'_1=\Delta W'_L+\Delta W=\Delta W'$. This change in the depletion region thickness $\Delta W'$ is due to the change in the first DC voltage $\Delta V'_{DC1}$ and the tuning sensitivity is represented by $\Delta W'/\Delta V'_{DC1}$ for this TFBAR. The value of $\Delta W'/\Delta V'_{DC1}$ is noticeably larger than the $\Delta W/\Delta V_{DC1}$ in FIG. 3E where the doping concentrations in the first semiconducting piezoelectric layer and in the third semiconducting piezoelectric layer are high. Therefore, it is clear that the tuning sensitivity is related to the doping concentration in the doped piezoelectric layers.

Figure 4G:
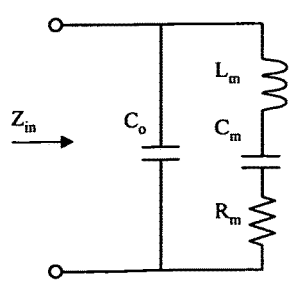
FIG. 4G is an equivalent circuit, developed by a modified Butterworth-Van Dyke model (MBVD) which may be used to represent an ideal FBAR. Here $C_o$ is the static plate capacitor and $L_m$, $C_m$ and $R_m$ are motional inductor, capacitor and resistor respectively. The series resonant frequency is given by $f_s = [1/2\pi][1/L_m C_m]^{1/2}$ and the parallel resonant frequency $f_p = [1/2\pi][1/(L_m C_m)(1+C_m/C_o)]^{1/2}$ $k^2_{eff} = (\pi/2)^2 [(f_p - f_s)/f_p]$.

FIG. 4G is equivalent circuit may be used to represent an ideal FBAR, which is presented by J. Larson et al in an article titled "Modified Butterworth-Van Dyke Circuit for FBAR Resonators and Automated Measurement System" (2000 IEEE Ultrasonic Symposium pp. 863-868). Here, $C_o$ is the static plate capacitor defined by the piezoelectric layer thickness, $L_m$, $C_m$ and $R_m$ are the motional inductor, capacitor and resistor respectively and $Z_{in}$ is the equivalent input impedance. The series resonant frequency is given by $f_s=[1/2\pi][1/L_mC_m]^{1/2}$ and the parallel resonant frequency is given by $f_p=[1/2\pi][1/(L_mC_m)(1+C_m/C_o)]^{1/2}$ $(k^2_{eff})=(\pi/2)^2[(f_p-f_s)/f_p]$. When several resonators are connected into a ladder filter, the frequencies for the transmission band and the bandwidths are determined by the series resonance frequency $f_{sP}$ of the parallel resonators (or the shunt resonators) and the parallel resonance frequency $f_{pS}$ of the series resonators. For a tunable FBAR or a TFBAR according to this invention, the static capacitor $C_o$, motional components $L_m$, $C_m$ and $R_m$ are tuned and adjusted by the first DC biasing voltage. In the design of a ladder or a lattice filter, the dimensions of the shunt resonators or the parallel resonators are selected to be slightly different from that of the series resonators to adjust the bandwidth for a given value of the first DC biasing voltage. When the value of the first DC voltage is varied, the combined first piezoelectric active layer thickness $W_1$, $W_2$ in FIG. 4E (or (250IT) in FIG. 2A, (250T't) in FIG. 2B and (250T"t) in FIG. 2C) is increased or decreased, leading to a change in values of $C_o$, $L_m$, $C_m$ and $R_m$. Hence values of the series resonance frequency $f_{sP}$ of the parallel resonators and the parallel resonance frequency $f_{pS}$ of the of the series resonators are tuned and adjusted to new values. This leads to a tuning and adjustment of the transmission frequency of the filter constructed using the TFBAR. In addition, when a first DC voltage is applied, there is a formation of a first piezoelectric layer neutral region, which forms a part of the load mass together with the top electrode layer, increases the loading mass and effects a second component of change in the resonant frequency.

Figure 4H:
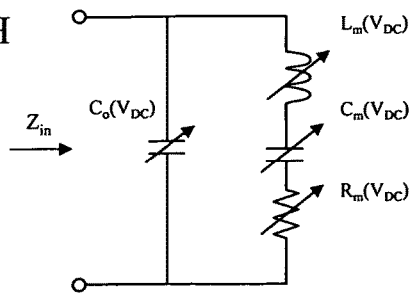
FIG. 4H is an equivalent circuit for a TFBAR according to this invention where the static capacitor $C_o$, the motional components $L_m$, $C_m$ and $R_m$ are tuned and adjusted by the first DC biasing voltage $V_{DC}$. Hence values of the series resonance frequency $f_{sP}$ of the parallel resonators and the parallel resonance frequency $f_{pS}$ of the of the series resonators are tuned and adjusted, leading to a tuning and adjustment of the transmission frequency of the filter constructed using the TFBAR.

FIG. 4H is equivalent circuit for an tunable film bulk acoustic wave resonator or TFBAR according to this invention where the static capacitor $C_o$, motional components $L_m$, $C_m$ and $R_m$ are tuned and adjusted by the first DC biasing voltage $V_{DC}$ in TFBARs containing doped piezoelectric semiconductor layers. When the value of the first DC voltage is varied, the piezoelectric layer depletion region thickness varies. This lead to a change to the combined first piezoelectric active layer thickness $W_1$, $W_2$ in FIG. 4E (or (250IT) in FIG. 2A, (250T't) in FIG. 2B and (250T"t) in FIG. 2C) is increased or decreased. Because the combined first piezoelectric active layer is responsible for the interactions between the electrical signals and the mechanical actions or acoustic waves, there will be corresponding changes in values of $C_o$, $L_m$, $C_m$ and $R_m$. Hence values of the series resonance frequency $f_{sP}$ of the parallel resonators and the parallel resonance frequency $f_{pS}$ of the series resonators are tuned and adjusted to new values. This leads to a tuning and adjustment of the transmission frequency of the filter constructed using the TFBAR. In the design of a ladder or lattice filter, the dimensions of the parallel resonators are selected to be slightly different from that of the series resonators to adjust the bandwidth for a given value for the first DC biasing voltage. In the equivalent circuit, another component may be included to account for the change in mass loading on the resonant frequency.

Tunable TFBAR Microwave Filter Circuits:

According to still another embodiment of this invention, a plurality of tunable resonators TFBARs are connected and biased by adjustable DC voltages to achieve tuning or adjusting of resonant frequencies for forming a film bulk acoustic resonator filter for filtering microwaves in microwave communication applications.

FIG. 5A is a schematic diagram showing two tunable TFBAR resonators (340, 350) connected to form a microwave filter circuit (500a) according to this invention. The microwave filter circuit (500a) comprises a first series resonator (340) and a second parallel or shunt resonator (350) connected at a first contact point (350T); a first coupling capacitor (340C) and a second coupling capacitor (350C) for blocking of DC voltages; a first isolation inductor (340L) for blocking of RF signals; and a first DC voltage source $V_{DC1}$ connected at a first source point (340ST). When the first DC voltage source $V_{DC1}$ with a voltage value $V_{1s}$ is applied between the source point (340ST) and a common point (330), the first DC voltage $V_{1s}$ is applied across the combination of the first series resonator (340) and the second parallel resonator (350) through the first isolation inductor (340L) to establish biasing of the first series resonator (340) and the second parallel resonator (350). The bias voltage across the second resonator (350) is $V_{1s}'$ and the bias voltage across the first resonator (340) is given by $V_{1s}-V_{1s}'$. The biasing voltages control the central frequency of resonant $f_{o1}$ and effect transmission of a RF signal (360) applied to a first RF input contact (310) so that microwaves signals at and around the central frequency $f'_{o1}$ and within the bandwidth BW1 are allowed to propagate through the first resonator (340) to reach an RF output contact (320). The central frequency $f_{o1}$ of transmission of microwaves is selected or controlled by value of the first DC voltage source $V_{DC1}$ according to this invention. A single first DC voltage source $V_{DC1}$ is adopted in the microwave filter circuit (500a) to maintain biasing the first resonator (340) and the second resonator (350).

FIG. 5B is a schematic diagram showing two tunable TFBAR resonators (340, 350) connected to form a microwave filter circuit (500b) according to this invention. The microwave filter circuit (500b) comprises a first series resonator (340) and a second parallel or shunt resonator (350) connected at a first contact point (350T); a first coupling capacitor (340C) and a second coupling capacitor (350C) for blocking of a DC voltage; a first isolation inductor (340L) and a second isolation inductor (350L) for isolation of RF signals; a first DC voltage source $V_{DC1}$ connected at a first source point (340ST) and a second DC voltage source $V_{DC2}$ connected at a second source point (350ST). Two DC voltage sources are adopted in the microwave filter circuit (500b) according to this invention to maintain biasing of the first series resonator and the second parallel resonator. When the first DC voltage source $V_{DC1}$ with a voltage value $V_{1s}$ is applied between the first source point (340ST) and a common ground point (330), the first DC voltage $V_{1s}$ is applied through the first isolation inductor (340L) across the combination of the first series resonator (340) and second parallel resonator (350) to establish biasing of the first series resonator (340) and the second parallel resonator (350). When the second DC voltage source $V_{DC2}$ with a second voltage value $V_{1p}$ is applied between the second source point (350ST) and the common ground point (330), the second DC voltage $V_{2s}$ is applied through the second isolation inductor (350L) across the second parallel resonator (350) to establish biasing of the second parallel resonator (350). The bias voltage across the second resonator (350) is $V_{1p}$ and the bias voltage across the first resonator (340) is given by $V_{1s}-V_{1p}$. The first and second DC voltage sources control the central frequency $f'_{o1}$ and effect transmission of RF signal (360) applied to a first RF input contact (310) so that microwaves signal at and around the central frequency $f_{o1}$ are allowed to propagate through the first series resonator (340) to reach an RF output contact (320). Central frequency $f_{o1}$ of transmission of microwaves is selected or controlled by value of the first DC voltage source $V_{DC1}$ and the second DC source $V_{DC2}$. By changing the first DC voltage value $V_{1s}$ and the second DC voltage value $V_{1p}$, the biasing voltage across the first series resonator (340) and the second parallel resonator (350) can be controlled to be different.

FIG. 5C shows a schematic diagram of a 3½ stage ladder filter (500c) for microwaves according to this invention. The 3½ stage ladder filter (500c) comprises first series resonators (340-1, 340-2, 340-3); second parallel resonators (350-1, 350-2, 350-3, 350-4), first coupling capacitors (340-0C, 340-1C, 340-2C, 340-3C) and a second coupling capacitor (350-4C) for blocking of a DC voltage; first isolation inductors (340-1L, 340-2L, 340-3L) and a second isolation inductor (350-1L) for isolation of RF signals; first DC voltage sources $V_{DC1}$ with a voltage value $V_{1s}$, $V_{s2}$, $V_{s2}$ connected at first source points (340ST) and a second DC voltage source $V_{DC2}$ with a voltage value $V_{op}$ connected at a second source point (350ST). The first DC voltage sources $V_{DC1}$ could be three separated voltage sources with different voltage values $V_{1s}$ $V_{s2}$, $V_{s2}$ or with the same voltage value. The first DC voltage sources $V_{DC1}$ could also be a single DC voltage source $V_{DC1}$ with a voltage value of $V_{1s}$ or $V_{s2}$, or $V_{s2}$. In the 3½ stage ladder filter (500c), each pair of the series resonator and the parallel resonator is connected at a first contact point (340-1T, 340-2T, 340-3T) and the second parallel resonator (350-1) is connected to the first coupling capacitor (340-0C) and the second isolation inductor (350-1L) at a second contact point (350-1T). The first DC voltage source $V_{DC1}$ with voltage values $V_{1s}$, $V_{2s}$, $V_{3s}$ is applied through the first isolation inductors (340-1L, 340-2L, 340-3L) across the combination of the first series resonators (340-1, 340-2, 340-3) and second parallel resonators (350-2, 350-3, 350-4) to establish biasing of the first series resonators (340-1, 340-2, 340-3) and the second parallel resonators (350-2, 350-3, 350-4). The second DC voltage source $V_{DC2}$ with a voltage of $V_{0p}$ is applied to a second parallel resonator (350-1) through (350-1L) to establish biasing to (350-1). The biasing voltages control the central frequency $f_{o1}$ and effect transmission of a RF signal (360) applied to a first RF input contact (310) so that microwaves signals at and around the central frequency $f_{o1}$ and within the first bandwidth BW1 are allowed to propagate through the first resonators (340-1, 340-2, 340-3) to reach an RF output contact (320). Central frequency $f_{o1}$ of transmission of microwaves is selected or controlled by adjusting values of the first DC voltage sources $V_{DC1}$ and values of second DC voltage source $V_{DC2}$ according to this invention. Additional inductors may be added between each second parallel resonator and the ground (Common).

FIG. 5D is a schematic diagram of a 3½ stage ladder filter (500d) microwaves according to this invention. The stage ladder filter (500d) comprises first series resonators (340-1, 340-2, 340-3); second parallel resonators (350-1, 350-2, 350-3, 350-4); first coupling capacitors (340-0C, 340-1C, 340-2C, 340-3C) and a second coupling capacitor (350-4C) for blocking of a DC voltage; first isolation inductors (340-1L, 340-2L, 340-3L) and second isolation inductors (350-1L, 350-2L, 350-3L, 350-4L) for isolation of RF signals; first DC voltage sources $V_{DC1}$ with voltage values of $V_{1s}$, $V_{2s}$, $V_{3s}$ and second DC voltage sources $V_{DC2}$ with voltage values of $V_{0p}$, $V_{1p}$, $V_{2p}$, $V_{3p}$. In the stage ladder filter (500d), each pair of the series resonator and the parallel resonator is connected at a first contact point (340-1T, 340-2T, 340-3T) and the second parallel resonator (350-1) is connected to the first coupling capacitor (340-0C) and the second isolation inductor (350-1L) at a second contact point (350-1T). The first DC voltage sources $V_{DC1}$ with voltage values $V_{1s}$, $V_{2s}$, $V_{3s}$ is applied through the first isolation inductor (340-1L, 340-2L, 340-3L) across the combination of the first series resonators (340-1, 340-2, 340-3) and the second parallel resonators (350-2, 350-3, 350-4) to establish biasing of the first series resonators (340-1, 340-2, 340-3) and the second parallel resonators (350-2, 350-3, 350-4). The second DC voltage sources $V_{DC2}$ with voltage values of $V_{0p}$, $V_{1p}$, $V_{2p}$, $V_{3p}$ are applied to the second parallel resonators (350-1, 350-2, 350-3, 350-4) through second isolation inductors (350-1L, 350-2L, 350-3L, 350-4L) to establish biasing to each of the parallel resonators (350-1, 350-2, 350-3, 350-4). The biasing voltages control the central frequency $f_{o1}$ and effect transmission of a RF signal (360) applied to a first RF input contact (310) so that microwaves signals at and around the central frequency $f_{o1}$ and within the first bandwidth BW1 are allowed to propagate through the first series resonators (340-1, 340-2, 340-3) to reach an RF output contact (320). Central frequency $f_{o1}$ of transmission of microwaves is selected or controlled by adjusting values of the first DC voltage sources $V_{DC1}$ and values of the second DC voltage sources $V_{DC2}$ according to this invention. Additional inductors may be added between each second parallel resonator and the ground (Common).

What is claimed is:

1. A tunable film bulk acoustic resonator TFBAR for forming a tunable microwave acoustic filter and a tunable oscillator for microwave applications, comprises
    a substrate with a substrate thickness;
    an acoustic wave isolation region with an acoustic wave isolation region thickness;
    a bottom support membrane with a bottom support membrane thickness;
    a bottom electrode of a bottom electrode material and a bottom electrode thickness;
    a first piezoelectric layer with a first piezoelectric layer thickness, said first piezoelectric layer is a piezoelectric semiconductor with a first conducting type and is doped to a first impurity concentration; and
    a top electrode of a top electrode material and a top electrode thickness,
wherein said first piezoelectric layer is sandwiched between said bottom electrode and said top electrode and has a first piezoelectric layer depletion region with a first piezoelectric layer depletion region thickness and is controlled by a first DC voltage applied between said top electrode and bottom electrode, forming a first piezoelectric active layer to effect interactions between RF electrical signals applied between said top electrode and bottom electrode and mechanical vibrations in said first piezoelectric active layer to excite acoustic waves to effect control, selection and adjustment of resonant frequencies of said TFBAR when forming a microwave filter.

2. A tunable film bulk acoustic resonator TFBAR for forming a tunable microwave acoustic filter and a tunable oscillator for microwave applications as defined in claim 1, wherein said acoustic wave isolation region is an air cavity to minimize unwanted loss of acoustic wave energy into said substrate.

3. A tunable film bulk acoustic resonator TFBAR for forming a tunable microwave acoustic filter and a tunable oscillator for microwave applications as defined in claim 1, materials of said bottom support membrane and bottom support membrane thickness are selected to effect a temperature compensation to reduce unwanted shift of resonant frequency during operation.

4. A tunable film bulk acoustic resonator TFBAR for forming a tunable microwave acoustic filter and a tunable oscillator for microwave applications as defined in claim 1, wherein said first impurity concentration of said first piezoelectric layer is preferably selected in a range of $10^{14}$ to $10^{22}$ cm$^{-3}$ to control sensitivity of said first DC voltage on control of said first piezoelectric layer depletion region thickness and hence sensitivity of control of said resonant frequency.

5. A tunable bulk acoustic resonator TFBAR for forming a tunable microwave acoustic filter and a tunable oscillator for microwave applications as defined in claim 1, material of said first piezoelectric layer is selected from a group including: AlN, GaN, AlGaN, ZnO, GaAs, AlAs, and AlGaAs.

6. A tunable bulk acoustic resonator TFBAR for forming a tunable microwave acoustic filter and a tunable oscillator for microwave applications as defined in claim 1, whereas material of said substrate is selected from a group including: Si, GaAs, glass, sapphire, AlN, and $Al_2O_3$ as long as it has high electrical resistivity, good thermal conductivity and flat surfaces.

7. A tunable film bulk acoustic resonator TFBAR for forming a tunable microwave acoustic filter and a tunable oscillator for microwave applications as defined in claim 1, further comprising an un-doped second piezoelectric layer with a second piezoelectric layer thickness situated between said bottom electrode and said first piezoelectric layer, said second piezoelectric layer and said first piezoelectric layer depletion region forming a combined first piezoelectric active layer with a combined first piezoelectric active layer thickness, wherein said combined first piezoelectric active layer thickness is controlled and adjusted by said first DC voltage to effect control and adjustment of resonant frequency of said TFBAR for forming into a microwave filter, wherein material of said un-doped second piezoelectric layer is selected from a group including AlGaN, AlAs, AlGaAs, $LiNbO_3$, PZT, $BaTiO_3$, quartz and $KNbO_3$ as long as they are piezoelectric with large acoustic-electric coupling coefficients and are compatible to said first piezoelectric layer.

8. A tunable film bulk acoustic resonator TFBAR for forming a tunable microwave acoustic filter and a tunable oscillator for microwave applications as defined in claim 1, further comprising an un-doped second piezoelectric layer with a second piezoelectric layer thickness situated between said top electrode and said first piezoelectric layer, said second piezoelectric layer and first piezoelectric layer depletion region forming a combined first piezoelectric active layer with a combined first piezoelectric active layer thickness, wherein said combined first piezoelectric active layer thickness is controlled and adjusted by said first DC voltage to effect control and adjustment of resonant frequency of said TFBAR for forming into a microwave filter, wherein material of said un-doped second piezoelectric layer is selected from a group including: AlGaN, AlAs, AlGaAs, $LiNbO_3$, PZT, $BaTiO_3$, quartz and $KNbO_3$ as long as they are piezoelectric with large acoustic-electric coupling coefficients and are compatible to said first piezoelectric layer.

9. A tunable film bulk acoustic resonator TFBAR for forming a tunable microwave acoustic filter and a tunable oscillator for Microwave applications as defined in claim 1, further comprising control within said first piezoelectric layer thickness of a first piezoelectric layer neutral region thickness to control loading caused by said first piezoelectric layer neutral region to further adjust and control said resonant frequency by the application of said first DC voltage.

10. A tunable film bulk acoustic resonator TFBAR for forming a tunable microwave acoustic filter and a tunable oscillator for microwave applications as defined in claim 1, wherein said top electrode material, bottom electrode material, top electrode thickness, and bottom electrode thickness are selected such that the first DC voltage controls and adjusts a loading effect due to the presence of said bottom electrode and top electrode.

11. A tunable film bulk acoustic resonator TFBAR for forming a tunable microwave acoustic filter and a tunable oscillator for microwave applications comprises a substrate with a substrate thickness; an acoustic wave isolation region with an acoustic wave isolation region thickness; a bottom support membrane with a bottom support membrane thickness on said substrate and acoustic wave isolation region; a bottom electrode with a bottom electrode thickness on said bottom support membrane; a first doped piezoelectric layer with a first piezoelectric layer thickness and a first doping type on said bottom electrode; a second undoped piezoelectric layer with a second piezoelectric layer thickness on said first piezoelectric layer; a fourth heavily doped piezoelectric layer with a fourth piezoelectric layer thickness on said second piezoelectric layer and connected to a fourth piezoelectric layer contact; a fifth undoped piezoelectric layer with a fifth piezoelectric layer thickness on said fourth piezoelectric layer; a third doped piezoelectric layer with a third piezoelectric layer thickness and a third doping type opposite to said first doping type on said fifth piezoelectric layer; and a top electrode with a top electrode thickness, wherein said first piezoelectric layer has a first piezoelectric layer depletion region with a first piezoelectric depletion region thickness and a first piezoelectric layer neutral region with a first piezoelectric neutral region thickness whereas said third piezoelectric layer has a third Piezoelectric layer depletion region with a third piezoelectric depletion region thickness and a third piezoelectric layer neutral region with a third piezoelectric neutral region thickness, said first piezoelectric layer depletion region and said second piezoelectric layer form a first part of a first combined piezoelectric active layer whereas said third piezoelectric layer depletion region and said fifth piezoelectric layer form a second part of said first combined piezoelectric active layer, a first DC voltage is applied between said bottom electrode and said fourth piezoelectric layer contact to control thickness of said first part of said first combined piezoelectric active layer whereas a second DC voltage is applied between said top electrode and said fourth piezoelectric layer contact to control thickness of said second part of said first combined piezoelectric active layer to effect control and adjustment of a resonant frequency of said FBAR when forming a microwave filter.

12. A tunable film bulk acoustic resonator TFBAR for forming a tunable microwave acoustic filter and a tunable oscillator for microwave applications, comprises
    at least a substrate with a substrate thickness;
    an acoustic wave isolation region with an acoustic wave isolation region thickness;
    a bottom support membrane with a bottom support membrane thickness;
    a bottom electrode of a bottom electrode material with a bottom electrode thickness;
    a first piezoelectric layer with a first piezoelectric layer thickness, said first piezoelectric layer is a piezoelectric semiconductor with a first conducting type and doped to a first impurity concentration, said first piezoelectric layer has a first piezoelectric layer depletion region with a first piezoelectric depletion region thickness and a first piezoelectric layer neutral region with a first piezoelectric neutral region thickness;
    a third piezoelectric layer with a third piezoelectric layer thickness, said third piezoelectric layer is a piezoelectric semiconductor with a third conducting type and doped to a third impurity concentration, said third conducting type is opposite to said first conducting type, wherein said third piezoelectric layer has a third piezoelectric layer depletion region with a third piezoelectric depletion region thickness and a third piezoelectric layer neutral region with a third piezoelectric neutral region thickness; and
    a top electrode of a top electrode material with a top electrode thickness, wherein said third piezoelectric layer and first piezoelectric layer are sandwiched between said bottom electrode and said top electrode, said first piezoelectric layer depletion region and said third piezoelectric layer depletion region forms a combined first piezoelectric active layer having a combined first piezoelectric active layer thickness, said active layer thickness is controlled and adjusted by a first DC voltage applied between said bottom electrode and top electrode to effect interactions between RF electrical signals applied between said top electrode and bottom electrode and mechanical vibrations to excite acoustic waves to achieve control, selection and adjustment of resonant frequencies of said TFBAR when forming a microwave filter.

13. A tunable film bulk acoustic resonator TFBAR for forming a tunable microwave acoustic filter and a tunable oscillator for microwave applications as defined in claim 12, wherein said acoustic wave isolation region is an air cavity having an acoustic wave isolation region thickness, to minimize unwanted loss of acoustic waves into said substrate.

14. A tunable film bulk acoustic resonator TFBAR for forming a tunable microwave acoustic filter and a tunable oscillator for microwave applications as defined in claim 12, wherein said first impurity concentration of the first piezoelectric layer is preferably selected to be in a range of $10^{14}$ cm$^{-3}$ to $10^{22}$ cm$^{-3}$, whereas said third impurity concentration of the third piezoelectric layer is preferably selected to be in a range of $10^{14}$ cm$^{-3}$ to $10^{22}$ cm$^{-3}$, to control and adjust sensitivity of said first DC voltage on control of said first piezoelectric layer depletion region thickness and third piezoelectric layer depletion region thickness and hence sensitivity of control and adjustment of said resonant frequency.

15. A tunable film bulk acoustic resonator TFBAR for forming a tunable microwave acoustic filter and a tunable oscillator for microwave applications as defined in claim 12, materials of said bottom support membrane and bottom support membrane thickness are selected to effect a temperature compensation to reduce any unwanted shift of resonant frequency during operation.

16. A tunable bulk acoustic resonator TFBAR for forming a tunable microwave acoustic filter and a tunable oscillator for microwave applications as defined in claim 12, materials of said first piezoelectric layer and said third piezoelectric layer are selected from a group including: AlN, GaN, AlGaN, ZnO, GaAs, AlAs, and AlGaAs.

17. A tunable bulk acoustic resonator TFBAR for forming a tunable microwave acoustic filter and a tunable oscillator for microwave applications as defined in claim 12, whereas material for said substrate is selected from a material group of: Si, GaAs, glass, sapphire, AlN, Al$_2$O$_3$ as long as they have high electrical resistivity, good thermal conductivity and flat surfaces.

18. A tunable film bulk acoustic resonator TFBAR for forming a tunable microwave acoustic filter and a tunable oscillator for microwave applications as defined in claim 12, wherein said top electrode material, bottom electrode material, top electrode thickness, and bottom electrode thickness are selected such that the first DC voltage controls and adjusts a loading effect due to the presence of said bottom electrode and top electrode.

19. A tunable microwave film bulk acoustic filter comprising, at least one first series tunable resonator; at least one second parallel tunable resonator, each pair of said first series tunable resonator and second parallel tunable resonator being connected to each other at a first contact point; at least a first coupling capacitor and at least a second coupling capacitor for blocking of a DC voltage; at least a first isolation inductor for blocking of RF signals; if least a first DC voltage source ($V_{DC1}$) with a voltage value $V_{1s}$ applied through said first isolation inductor and across the combination of said first series tunable resonator and second parallel tunable resonator to establish biasing of said first series tunable resonator and second parallel tunable resonator and to control and adjust central frequency of resonance and transmission of an RF signal applied to a first RF input contact so that microwaves signals at and around said central frequency of resonance are allowed to propagate through said at least one first series tunable resonator to reach an RF output contact so that central frequency of transmission of microwaves of said tunable microwave bulk acoustic filter is selected and controlled to a desired value by value of said first DC voltage source.

20. A tunable microwave film bulk acoustic filter as defined in claim 19, further comprising at least a second isolation inductor for isolation of RF signals and a second DC voltage source ($V_{DC2}$) connected to said second isolation inductor, said first DC voltage source ($V_{DC1}$) and said second DC voltage source ($V_{DC2}$) are adjusted so that central frequency of transmission of microwaves of said tunable film bulk acoustic filter is selected and controlled to a desired value by values of said first DC voltage source ($V_{DC1}$) and said second DC voltage source ($V_{DC2}$).

* * * * *